United States Patent
Sakai et al.

(10) Patent No.: US 6,970,065 B2
(45) Date of Patent: Nov. 29, 2005

(54) TRANSFORMER AND TRANSFORMER UNIT HAVING THE SAME

(75) Inventors: Shinichi Sakai, Nara (JP); Keiichi Satou, Daito (JP); Kenji Yasui, Yamatokoriyama (JP); Haruo Suenaga, Katano (JP); Hisashi Morikawa, Nara (JP); Yoshitaka Oda, Nara (JP); Nobuo Shirokawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 10/663,634

(22) Filed: Sep. 16, 2003

(65) Prior Publication Data
US 2004/0113740 A1 Jun. 17, 2004

(30) Foreign Application Priority Data

| Sep. 17, 2002 | (JP) | ............................. 2002-269961 |
| Mar. 19, 2003 | (JP) | ............................. 2003-076138 |
| Jul. 4, 2003 | (JP) | ............................. 2003-270939 |

(51) Int. Cl.$^7$ ............................................. H01F 27/30
(52) U.S. Cl. ....................... 336/208; 336/192; 336/198
(58) Field of Search ............................. 336/208, 198, 336/192, 83, 200

(56) References Cited

U.S. PATENT DOCUMENTS

| 3,931,549 A | * | 1/1976 | Berns et al. ................. 361/156 |
| 4,503,413 A | | 3/1985 | Stalzer |
| 4,939,623 A | | 7/1990 | Equi et al. .................... 361/399 |
| 6,483,412 B1 | * | 11/2002 | Holdahl et al. ............. 336/192 |
| 2001/0017583 A1 | | 8/2001 | Matsumoto |

FOREIGN PATENT DOCUMENTS

| EP | 0 289 013 A2 | 11/1988 |
| EP | 0 655 877 A2 | 5/1995 |
| JP | 6-267747 | 9/1994 |
| JP | 2001-189221 | 7/2001 |

* cited by examiner

Primary Examiner—Anh Mai
(74) Attorney, Agent, or Firm—Pearne & Gordon LLP

(57) ABSTRACT

It is an object to decrease an occupied space in a printed board to carry out space saving and to reduce the size of a unit without sacrificing the performance of a transformer and increasing a cost.

A transformer 11 is constituted by a bobbin 13 having at least a primary winding 15 and a secondary winding 17 wound therearound and a core 21, and the side surface of the bobbin 13 is provided with a component holding section for holding high-voltage components such as a capacitor 31 and a diode 33 which constitute a voltage doubler rectifying circuit for rectifying a high voltage having a high frequency from the secondary winding 15.

16 Claims, 22 Drawing Sheets

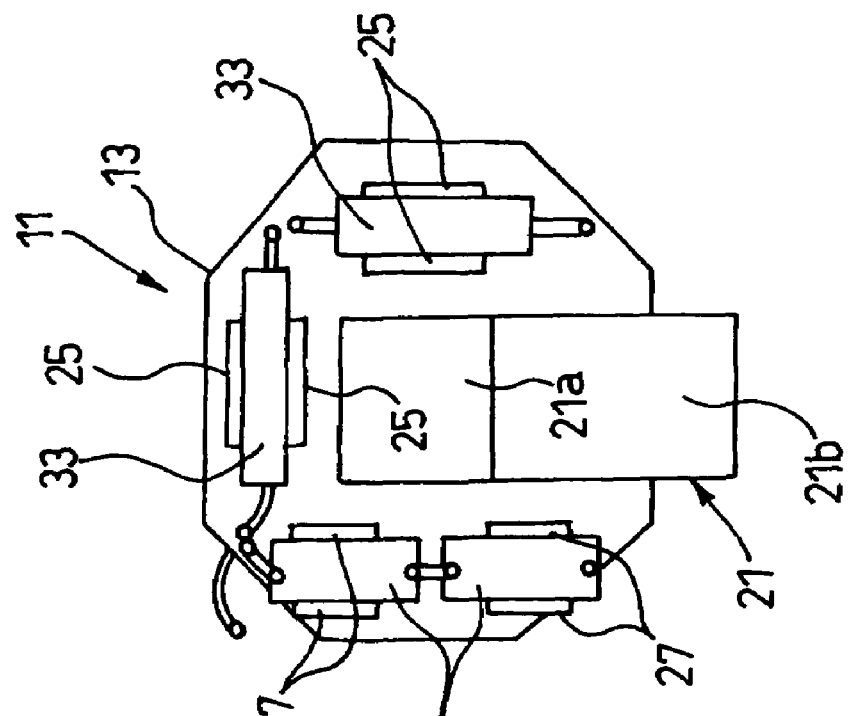
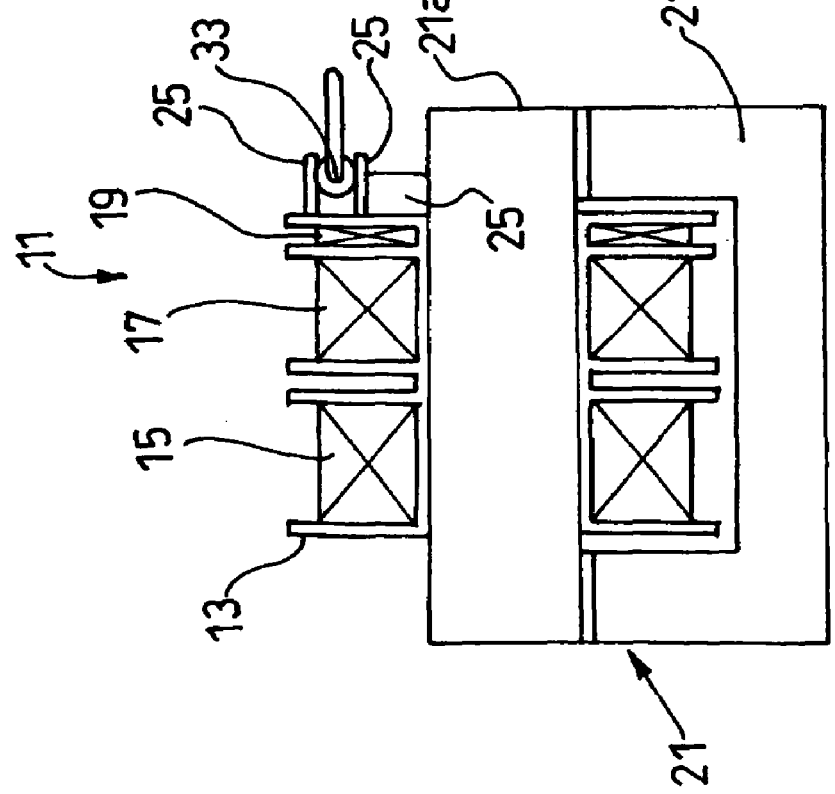
FIG. 1(a)
FIG. 1(b)

TRANSFORMER AND TRANSFORMER UNIT HAVING THE SAME

BACKGROUND OF THE INVENTION

1. Field of the Invention

The present invention relates to a transformer to be used in an inverter system high-frequency heating device and a transformer unit having the transformer.

2. Description of the Related Art

The inverter system high-frequency heating device includes a transformer unit 73 mounting a transformer 72 on a printed board 71 as shown in FIG. 17.

A circuit for the transformer unit 73 will be described with reference to FIG. 18.

A commercial power source 74 is full-wave rectified by a rectifying circuit 75 such as a diode bridge and the power is converted into a high-frequency voltage by an inverter 76, and the high-frequency voltage is applied to a primary winding 77 of the transformer 72. Consequently, a high voltage having a high frequency of several kV is generated on a secondary winding 78 of the transformer 72. The high voltage having the high frequency is rectified by a voltage doubler rectifying circuit 81 comprising a capacitor 79 and a diode 80. Thus, the high voltage is applied to a magnetron 82 to be a microwave generator. Moreover, a heater winding 83 of the transformer 72 is connected to a filament 84 of the magnetron 82 to heat the filament 84. The magnetron 82 oscillates a microwave by heating the filament 84 and applying the high voltage.

As shown in FIG. 19, the transformer 72 to be used in the transformer unit 73 has such a structure that a bobbin 85 has the primary winding 77, the secondary winding 78 and the heater winding 83 wound concentrically and a core 86 is inserted from both sides into the center of the bobbin 85. As shown in FIG. 20, the transformer 72 has a primary connecting pin 87, a secondary connecting pin 88, a heater connecting pin 89 and a ground connecting pin 90 in a bottom portion thereof, and is inserted in the through hole of the printed board 71 to be a mounting source and is connected to the circuit pattern of the printed board 71 by soldering.

FIG. 21 shows an example of the circuit pattern of the printed board 71, in which through holes 87A, 88A, 89A and 90A for inserting the primary connecting pin 87, the secondary connecting pin 88, the heater connecting pin 89 and the ground connecting pin 90 in the transformer 72 therethrough are formed. The through holes 88A and 89A inserting the secondary connecting pin 88 and the heater connecting pin 89 of the transformer 72 therethrough are formed in a high-voltage component region A, respectively. In the high-voltage component region A, moreover, a part of the transformer 72 is mounted, and furthermore, high-voltage components constituting the voltage doubler rectifying circuit 81, for example, the capacitor 79 and the diode 80 are mounted. In a region other than the high-voltage component region A of the printed board 71, moreover, various components constituting a weak voltage circuit such as a control circuit are mounted.

The transformer having the structure shown in FIG. 19 has been described in JP-A-2001-189221 gazette (FIG. 3), for example.

The high-frequency heating device has required a reduction in a size and an enhancement in a function. Therefore, there has been used a component having the size of each portion reduced and a higher added value.

However, the high-voltage components such as the capacitor 79 and the diode 80 which constitute the voltage doubler rectifying circuit 81 are much larger than components constituting the control circuit, and the size of the high-voltage component region A of the printed board 71 is increased in order to maintain a space for mounting these high-voltage components.

In addition, in the transformer unit 73, it is necessary to increase an interval between circuit patterns in order to prevent a leakage between the primary side to be the input side of the transformer 72 and the secondary side having a high voltage to be the output side. Consequently, the size of the high-voltage component region A in the printed board 71 is to be increased.

In the transformer unit 73 having the above structure, thus, the size of the high-voltage component region A is to be increased. Therefore, the printed board 71 itself becomes large-sized so that it is hard to meet the requirement for reducing the size of the high-frequency heating device.

On the other hand, as shown in FIG. 22, the high-voltage components such as the capacitor 79 and the diode 80 which constitute the voltage doubler rectifying circuit 81 are mounted on another small board 91, and the small board 91 is also erected on the printed board 71. With such a structure, however, the small board 91 is required separately. Consequently, a cost is increased. In addition, a large installation space in the printed board 71 is occupied by the small board 91. Thus, the size cannot be reduced.

SUMMARY OF THE INVENTION

The invention has been made in consideration of the circumstances and has an object to provide a transformer and a transformer unit having the transformer which can decrease an occupied space in a printed board to carry out space saving and can reduce the size of the unit without sacrificing the performance of the transformer and increasing a cost.

In order to attain the object, a first aspect of the invention is directed to a transformer having a bobbin around which at least a primary winding and a secondary winding are wound, and a core inserted through a center of the bobbin, and mounted on a printed board, wherein a component holding section for holding a component is provided in an outer peripheral portion excluding a mounting side on the printed board.

A second aspect of the invention is directed to the transformer, wherein the component holding section is formed on a side surface of the bobbin.

In the transformer according to the first or second aspect of the invention, the component holding section for holding a component is provided in the outer peripheral portion excluding the mounting side on the printed board, for example, the side surface of the bobbin By causing the component holding section to hold a component, therefore, it is possible to decrease the number of components to be mounted on the printed board. Accordingly, it is possible to reduce the size of the printed board without sacrificing the performance of the transformer and increasing a cost. Thus, it is possible to reduce the size of a transformer unit having the transformer mounted on the printed board. In use for a high-frequency heating device requiring a reduction in a size and an enhancement in a function, consequently, it is possible to obtain a suitable structure, for example.

A third aspect of the invention is directed to the transformer, wherein the component holding section is formed on a component fixing plate to be a separate member from the bobbin and the component fixing plate is fixed to the bobbin.

In the transformer, the component holding section is formed on the component fixing plate to be the separate member from the bobbin. Therefore, a work for attaching a component is carried out for the single component fixing plate. Thus, the work can be simplified. Moreover, it is easy to automatically assemble the component. Consequently, an assembly cost can be reduced.

A fourth aspect of the invention is directed to the transformer, wherein the bobbin includes a bobbin base member for winding at least the primary winding and the secondary winding therearound, and a side end flange section to be attached to one of ends of the bobbin base member, and the component holding section is formed in the side end flange section.

In the transformer, the bobbin is divided into the bobbin base member and the side end flange section, and the component holding section is formed in the side end flange section to be a separate member from the bobbin base member. Consequently, a work for attaching a component is carried out for the single side end flange section. Thus, the work can be simplified.

A fifth aspect of the invention is directed to the transformer, further comprising an insulating cover for covering a component held by the component holding section and attached to the bobbin side.

In the transformer, the component held by the component holding section is covered with the insulating cover. Consequently, it is possible to prevent the generation of a short circuit, thereby maintaining a high safety.

A sixth aspect of the invention is directed to the transformer, wherein an end of the secondary winding is protruded from the outer peripheral portion excluding the mounting side on the printed board.

In the transformer, the end of the secondary winding is protruded from the outer peripheral portion excluding the mounting side on the printed board. For example, therefore, the secondary winding can be directly connected to the end. Consequently, it is possible to lessen circuit patterns on the printed board. In particular, it is possible to eliminate the circuit pattern in a high-voltage component region in which an interval between patterns is to be increased because of a high voltage. Consequently, the size of the printed board can be reduced considerably.

A seventh aspect of the invention is directed to the transformer, wherein at least one of lead wires of components held by other component holding sections and connecting ends of the secondary winding is connected to a lead wire of the component held by the component holding section.

In the transformer, the lead wires of the components held by the component holding section or the lead wire and the end to be the lead wire of the secondary winding are connected directly. Therefore, it is possible to further reduce and simplify a circuit pattern in the printed board.

An eighth aspect of the invention is directed to a transformer unit mounting the transformer according to any of the first to seventh aspects of the invention on a printed board, comprising a voltage doubler rectifying circuit for rectifying a high voltage having a high frequency from the secondary winding of the transformer, a high-voltage component constituting the voltage doubler rectifying circuit being held by the component holding section.

In the transformer unit, a comparatively large high-voltage component constituting the voltage doubler rectifying circuit for rectifying the high voltage having the high frequency from the secondary winding is held by the component holding section of the transformer. Therefore, it is possible to minimize an occupied space by mounting a component on the printed board. Thus, it is possible to reduce a size without sacrificing the performance of the transformer and increasing a cost. In use for a high-frequency heating device requiring a reduction in a size and an enhancement in a function, consequently, it is possible to implement a suitable transformer unit, for example.

A ninth aspect of the invention is directed to the transformer unit, wherein a connecting end of the secondary winding is directly or indirectly connected to a lead wire of the high-voltage component via a post protruded from the bobbin.

A conductor strand used in the secondary winding is very thin. For this reason, there is a possibility that the secondary winding might be cut if a constant tension or more acts on the connecting end of the secondary winding connected to a connecting pin due to the run-out and looseness of the component holding section by an operating force in assembly when the transformer is to be assembled into the printed board.

However, the connecting end of the secondary winding is connected directly or indirectly to the lead wire of the high-voltage component through the post protruded from the bobbin. Even if a displacement is generated on the lead wire of the high-voltage component, therefore, it can be absorbed by the allowance of the secondary winding provided between the post and the lead wire and the secondary winding can be prevented from being cut.

In the case in which the secondary winding is once held in the post and is soldered to the lead wire of the high-voltage component, moreover, it is possible to prevent the winding from being fragile due to copper corrosion caused by high temperature soldering corresponding to unleading in recent years.

A tenth aspect of the invention is directed to the transformer unit, wherein a plate-shaped relay terminal is bonded to the lead wire of the high-voltage component connecting the connecting end of the secondary winding, and the connecting end of the secondary winding is connected to the relay terminal.

A conductor strand used in the secondary winding is very thin as described above. Therefore, the strand becomes fragile due to copper corrosion in solder bonding, and furthermore, becomes fragile due to a damage in welding for non-solder bonding such as fusing. For this reason, there is a possibility that the connecting end of the secondary winding connected to a connecting pin might be cut if a constant tension or more acts on the same connecting end due to the run-out and looseness of the component holding section by a vibration caused when or after the transformer is assembled into the printed board.

In the transformer unit, however, a run-out and a looseness are generated on the connecting pin due to an operating force in the assembly. Even if the high-voltage component to which the connecting end of the secondary winding is connected is displaced due to the run-out and looseness, the displacement is absorbed in a relay terminal and a post to be a spare holding section, thereby preventing a constant tension or more from acting on the connecting portion of the secondary winding and the terminal section. Consequently, it is possible to prevent the secondary winding from being cut and to enhance a reliability for a vibration in the assembly of the transformer into the board or transportation on the way.

An eleventh aspect of the invention is directed to the transformer unit according to any of the eighth to tenth aspects of the invention, wherein a mutual electrical connection of the lead wires of the high-voltage components provided on the component holding section is carried out through a plate-shaped connecting terminal serving as a radiation plate.

In the transformer unit, the plate-shaped connecting terminal used for the mutual electrical connection of the lead wires of the high-voltage components has a large radiating surface for the lead wires of these components, for example, and has an excellent radiating property. Therefore, heat generated on each high-voltage component can be efficiently radiated into an ambient atmosphere to prevent the temperature of each high-voltage component from being raised, and at the same time, a stress generated in the connecting portion due to the thermal expansion of the component can be suppressed. Consequently, it is possible to enhance the operating stability of each high-voltage component and to prolong the life of the connecting portion.

A twelfth aspect of the invention is directed to the transformer unit according to any of the eighth to eleventh aspects of the invention, wherein in a pair of diodes connected serially and a pair of capacitors connected serially in the voltage doubler rectifying circuit, a lead terminal of the diode is connected to one of leads of a heater winding incorporated in the transformer and a lead terminal of the capacitor is connected to the other lead of the heater winding.

In the transformer unit, in the case in which the diode and the capacitor in the voltage doubler rectifying circuit are to be connected to the heater winding incorporated in the transformer, the connecting portion on the heater winding side of the diode and the capacitor can also be connected to one of the leads of the heater winding through a single jumper wire. In such a connecting structure, however, the use of a dummy terminal on the printed board is indispensable in order to support the other lead of the heater winding on a distribution path.

With such a structure that the lead terminal of the diode and the lead terminal of the capacitor are individually connected to one of the leads of the heater winding and the other lead of the heater winding respectively as described above, however, the leads of the heater winding can be stably supported on the distribution path of the printed board by the connection of the diode and the capacitor. Consequently, the use of the dummy terminal can be omitted.

A thirteenth aspect of the invention is directed to the transformer unit according to any of the eighth to twelfth aspects of the invention, wherein the voltage doubler rectifying circuit and the core are connected to a ground terminal on the printed board through a common ground connecting terminal.

In the transformer unit, one ground connecting terminal also serves as the ground connection of the voltage doubler rectifying circuit and the ground connection of the core. As compared with the case in which the ground connection is to be individually carried out, therefore, the number of the ground connecting terminals to be used can be decreased, and at the same time, the working steps of the ground connection can be reduced. Thus, the productivity of the transformer unit can be enhanced and a cost can be reduced by a decrease in components.

A fourteenth aspect of the invention is directed to the transformer unit according to the thirteenth aspect of the invention, wherein the ground connecting terminal includes a lead connecting section to be connected to a lead wire of a high-voltage component constituting the voltage doubler rectifying circuit and a board connecting section to be connected to a ground contact, and a core connecting section implementing a conduction to a core is provided in elastic contact with an external surface of the core between the lead connecting section and the board connecting section.

In the transformer unit, the ground connecting terminal can connect the high-voltage component and the core to the ground terminal on the printed board by a comparatively simple structure including the lead connecting section and the core connecting section.

A fifteenth aspect of the invention is directed to the transformer unit, wherein a partition wall for separating the core from the high-voltage component held by the component holding section is erected in an outer peripheral portion of the bobbin provided with the component holding section.

In the transformer unit, the partition wall protruded from the bobbin is provided between the core and the high-voltage component, and the mutual rectilinear communication of the core and the high-voltage component is lacking. Consequently, there can be enhanced an insulating effect between the high-voltage component to which a high voltage is applied and the core to be grounded. Thus, it is possible to reliably prevent an insulation from being deteriorated by a discharge between the core and the high-voltage component or dust collected for a long period of time between the core and the high-voltage component. Moreover, the insulating effect between the high-voltage component and the core can be enhanced. As compared with a structure in which the partition wall is not provided, therefore, a gap between the core and the high-voltage component can be reduced and the size of the transformer unit can further be reduced.

A sixteenth aspect of the invention is directed to the transformer unit according to the fifteenth aspect of the invention, wherein the partition wall is extended to be higher than a height of protrusion of the high-voltage component from the bobbin.

In the transformer unit, the partition wall is extended to be higher than the height of protrusion of the high-voltage component from the bobbin. Consequently, an insulating distance can be maintained to be long and the insulating effect of the core and the high-voltage component can be more enhanced.

According to the transformer and the transformer unit having the transformer in accordance with the invention, the component holding section for holding a component is provided in the outer peripheral portion excluding the mounting side on the printed board. By causing the component holding section to hold the high-voltage component, therefore, it is possible to eliminate the mounting of the high-voltage component on the printed board. Accordingly, it is possible to reduce the size of the printed board without sacrificing the performance of the transformer and increasing a cost. Thus, the size of the transformer unit can be reduced. In use for a high-frequency heating device requiring a reduction in a size and an enhancement in a function, consequently, a suitable transformer unit can be implemented.

BRIEF DESCRIPTION OF THE DRAWINGS

FIG. 1 is sectional and side views for explaining the structure of a transformer according to the invention.

DESCRIPTION OF THE PREFFERED EMBODIMENTS

A preferred embodiment of a transformer and a transformer unit having the transformer according to the invention will be described below with reference to the drawings.

Figure 2:
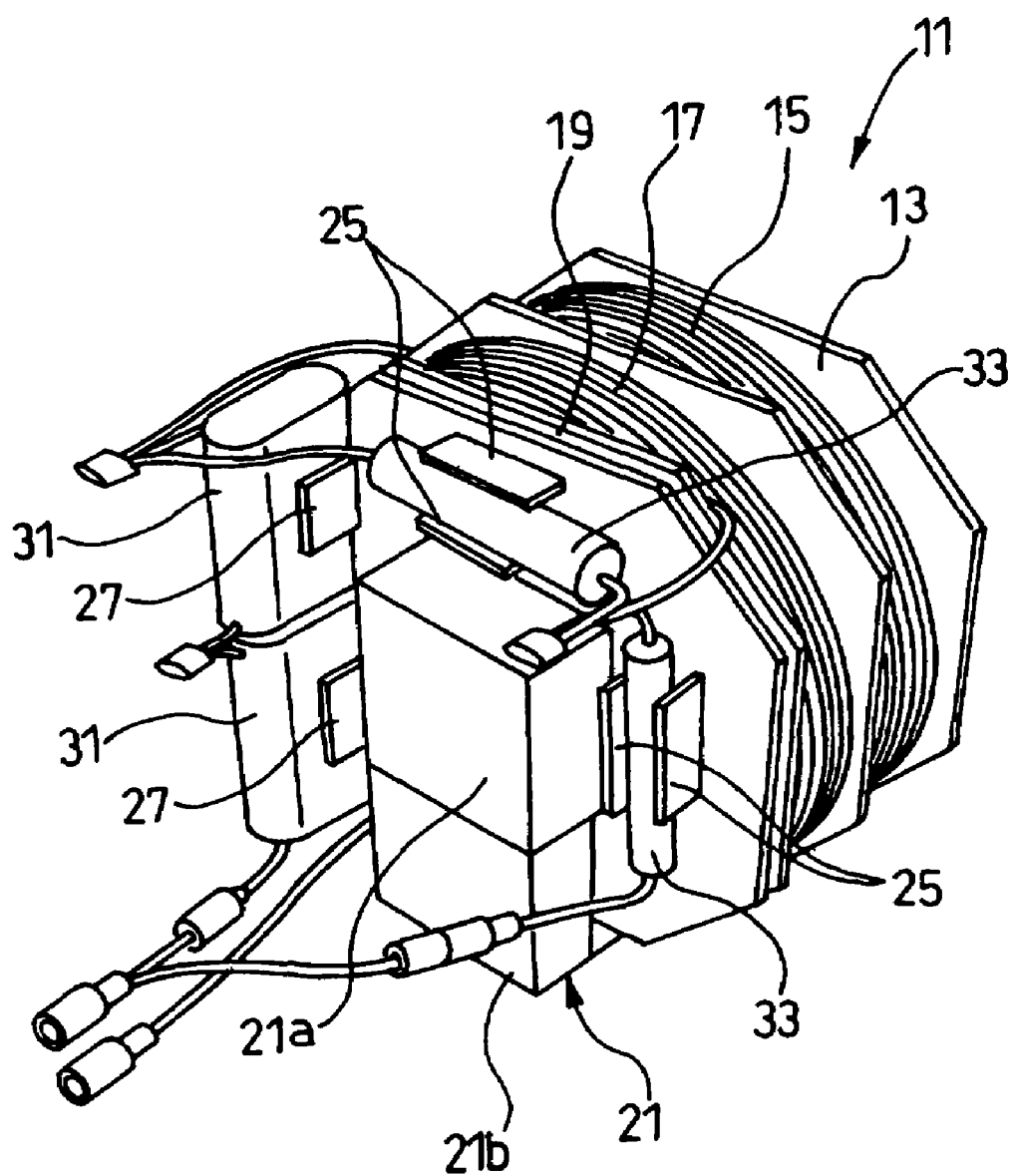
FIG. 2 is a perspective view for explaining the structure of the transformer.
Figure 3:
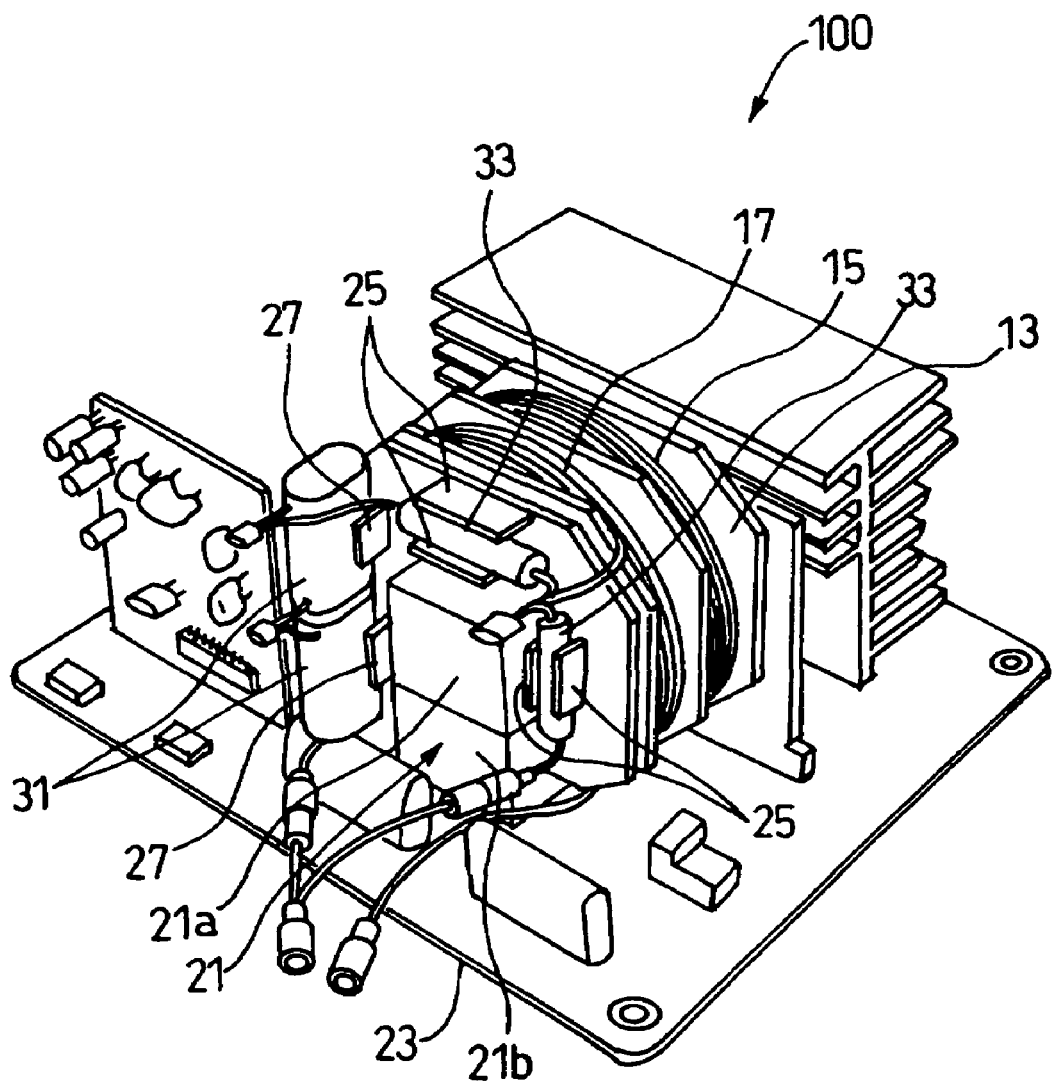
FIG. 3 is a perspective view for explaining the structure of a transformer unit having the transformer mounted thereon.

FIG. 1 is sectional and side views showing the transformer according to the invention, FIG. 2 is a perspective view showing the transformer, and FIG. 3 is a perspective view showing the transformer unit.

As shown in FIGS. 1 to 3, a transformer 11 to be mounted on the transformer unit according to the invention is mainly constituted by a bobbin 13 formed of a resin, a primary winding 15, a secondary winding 17 and a heater winding 19 which are wound around the bobbin 13, and a core 21.

The core 21 is constituted by an I-shaped core 21a having a rectangular section which is inserted through the center of the bobbin 13, and a U-shaped core 21b having a U shape seen from a side which is connected to both ends of the I-shaped core 21a, and the transformer 11 is mounted on a printed board 23 with the U-shaped core 21b turned downward.

The bobbin 13 has a side surface provided with a plurality of (four in total according to the embodiment) component holding sections having pairs of interposing pieces 25 and 27, respectively. In the component holding section, a capacitor 31 to be a high-voltage component constituting a voltage doubler rectifying circuit 81 is interposed between the pair of interposing pieces 27 and a diode 33 is interposed between the pair of interposing pieces 25.

While the component holding section according to the embodiment is formed with the pairs of interposing pieces 25 and 27 erected on the side surface of the bobbin 13 apart from each other by almost the thickness of the high-voltage component, the interposing pieces 25 and 27 are not restricted but any structure can be employed if the high-voltage component can be held.

Moreover, the lead wires of the capacitor 31 and the diode 33 to be the high-voltage components are protruded from the outer peripheral portion excluding the mounting side on the printed board 23, and the connecting ends of the secondary winding 17 and the heater winding 19 are connected to the lead wires based on circuits, respectively. Accordingly, a connecting cord from a magnetron is directly connected without using the printed board 23 in the outer peripheral portion excluding the mounting side of the transformer 11 on the printed board 23.

According to the transformer 11 and a transformer unit 100 formed by mounting the transformer 11 on the printed board 23, thus, the side surface of the bobbin 13 is provided with the component holding sections for holding the high-voltage components such as the condenser 31 and the diode 33. By causing the component holding section to hold the high-voltage component, therefore, it is possible to eliminate the high-voltage components to be mounted on the printed board 23.

Consequently, it is possible to reduce the size of the printed board 23 without sacrificing the performance of the transformer 11 and increasing a cost. Thus, the size of the transformer unit 100 can be reduced. In use for a high-frequency heating device requiring a reduction in a size and an enhancement in a function, the suitable transformer unit 100 can be obtained.

Moreover, the connecting ends of the secondary winding 17 and the heater winding 19 are connected to the outer peripheral portion excluding the mounting side of the transformer 11 on the printed board 23. Therefore, the connecting cord from the magnetron can be directly connected to the transformer 11 without using the printed board 23. Consequently, it is possible to lessen circuit patterns in the printed board 23, particularly, it is possible to eliminate the high-voltage circuit pattern of the transformer 11 in which an interval between the patterns is to be increased because of a high voltage. As shown in FIG. 3, therefore, the size of the printed board 23 can be reduced considerably.

In addition, at least one of the lead wires of the other high-voltage components and the connecting end of the secondary winding 17 and the heater winding 19 is directly connected to the lead wires of the high-voltage components such as the capacitor 31 and the diode 33 which are held in the component holding section. Consequently, the circuit pattern in the printed board 23 can further be reduced and simplified.

Figure 4:
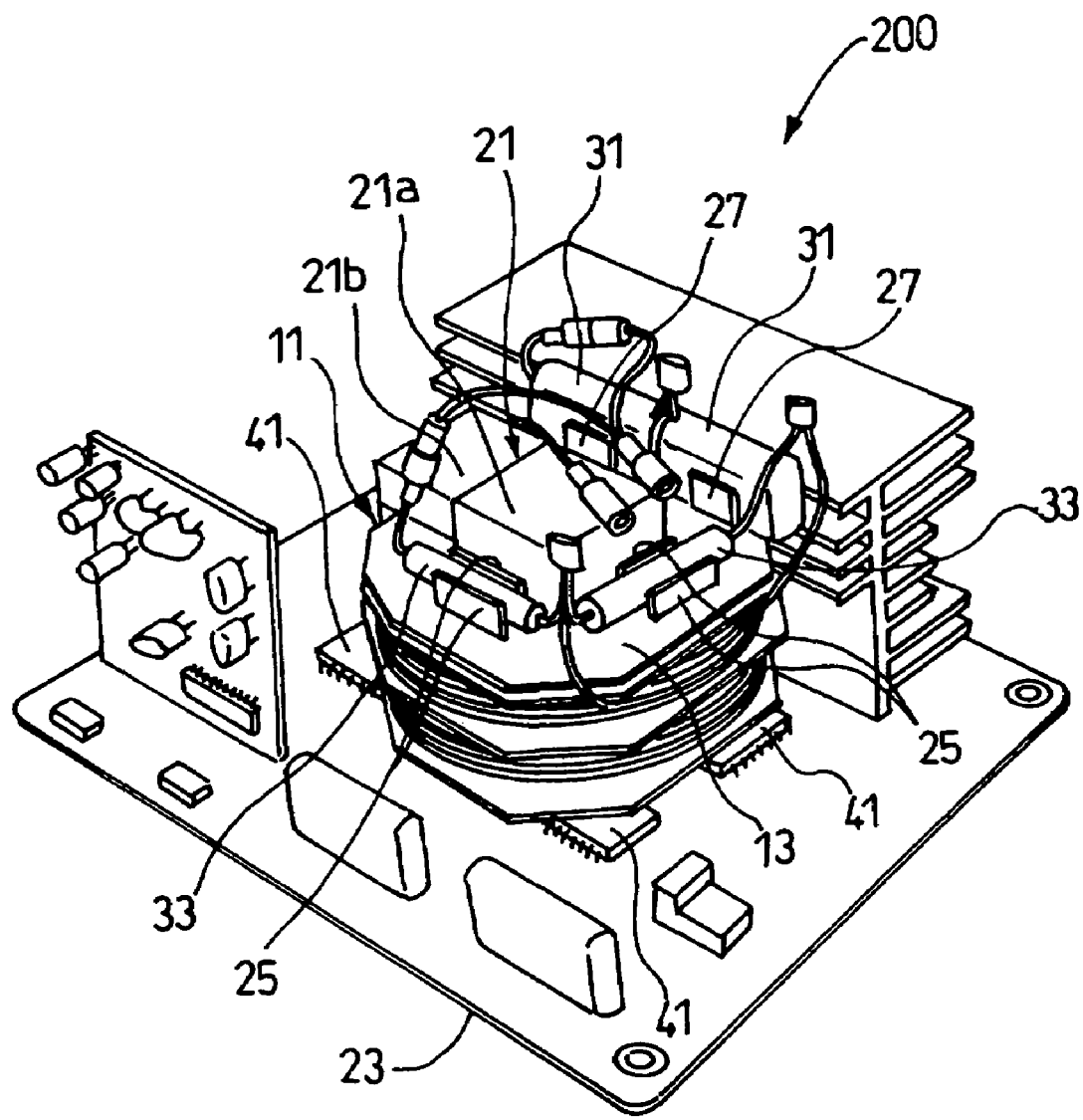
FIG. 4 is a perspective view showing a transformer unit in which the I-shaped core of the transformer is provided perpendicularly to a printed board and a high-voltage component is provided in an upper part.
Figure 5:
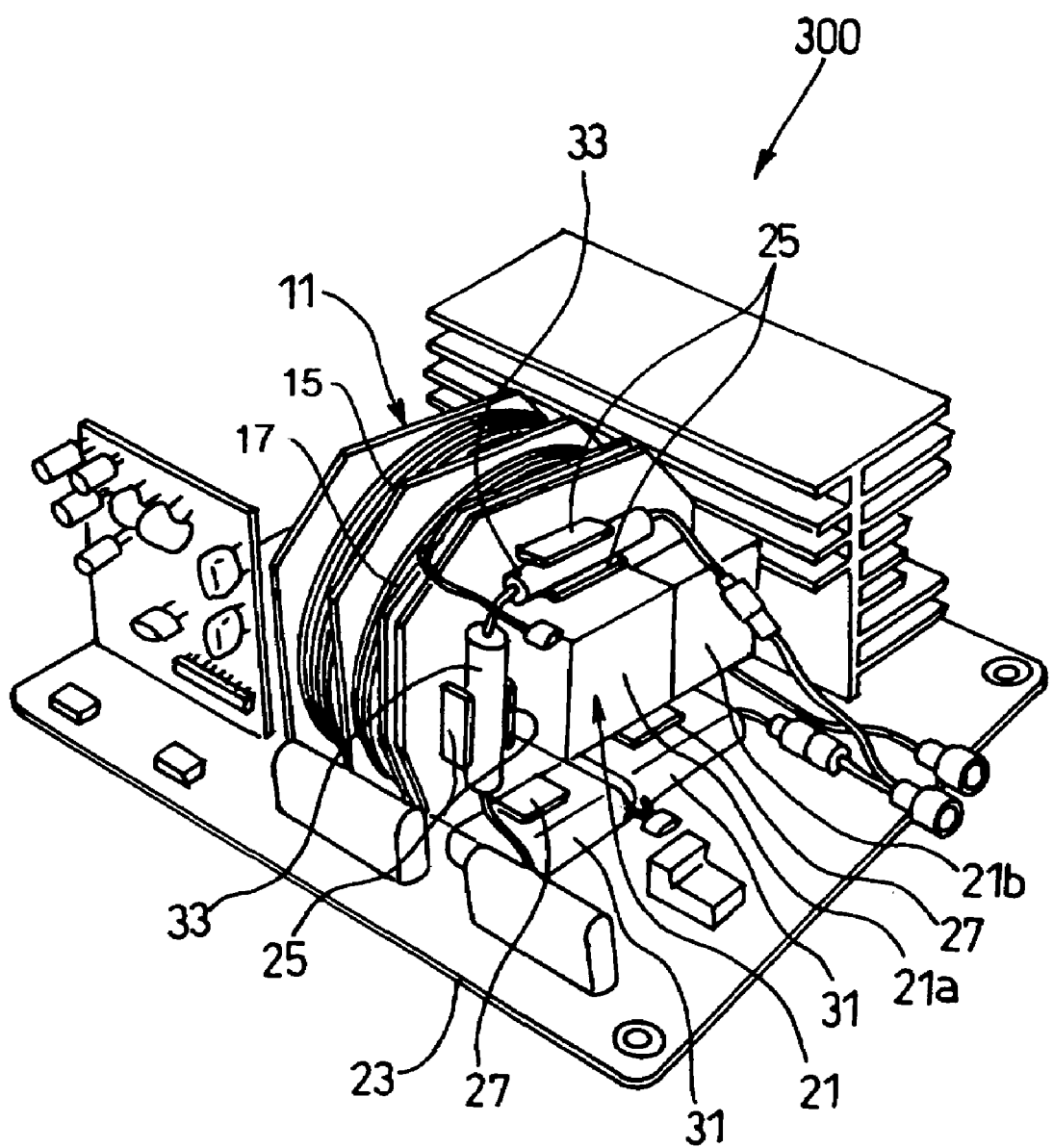
FIG. 5 is a perspective view showing a transformer unit in which the I-shaped core of the transformer is provided in parallel with the printed board and a U-shaped core is provided on the side of the transformer.
Figure 6:
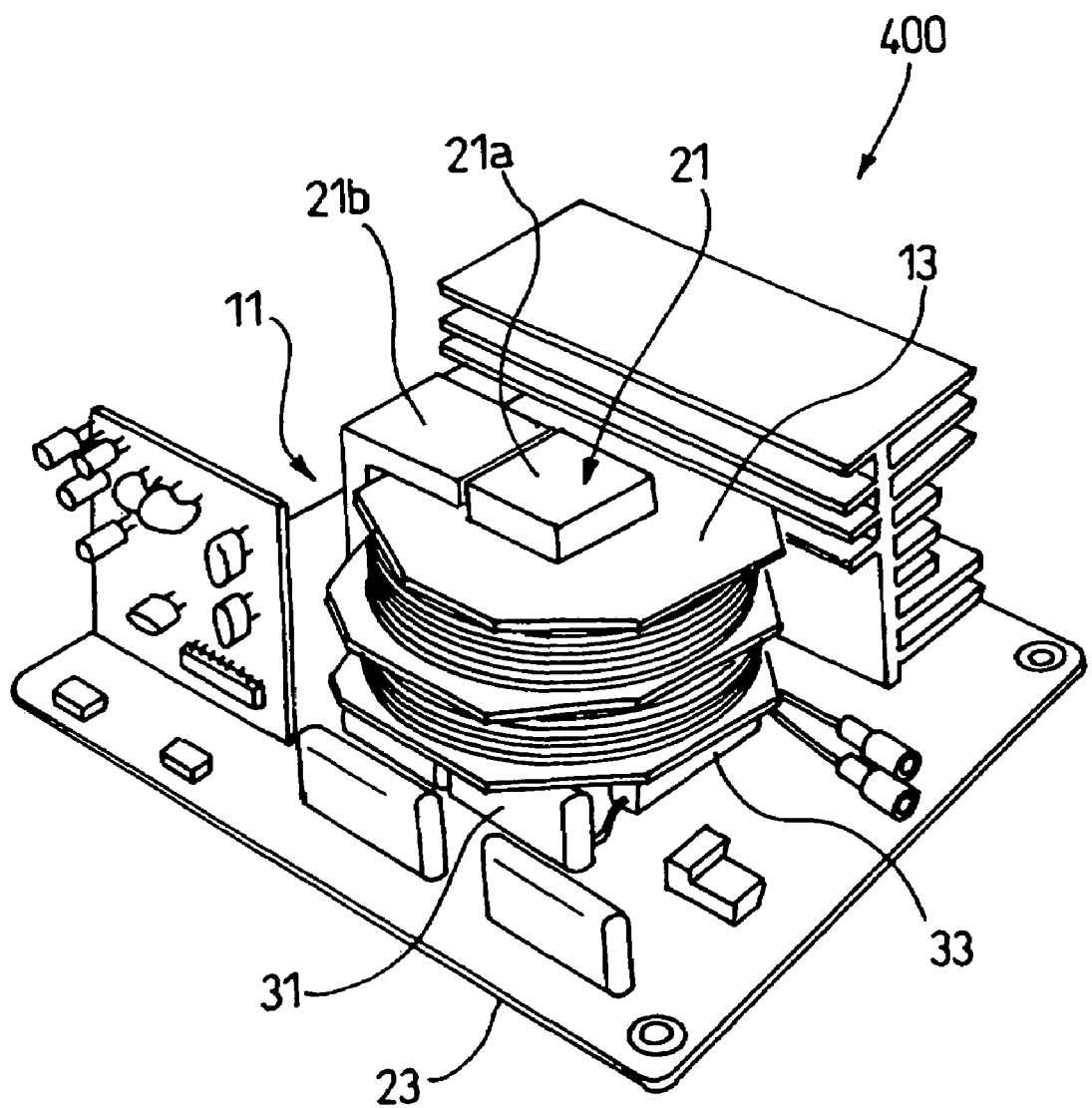
FIG. 6 is a perspective view showing a transformer unit in which the I-shaped core of the transformer is provided perpendicularly to the printed board and the high-voltage component is provided in a lower part.

A direction in which the transformer 11 is mounted on the printed board 23 is not restricted to a direction in which the U-shaped core 21b of the core 21 shown in FIG. 3 described above is set onto an underside but it is also possible to employ a configuration in which the I-shaped core 21a is provided perpendicularly to the printed board 23 as shown in FIG. 4, a configuration in which the I-shaped core 21a is provided in parallel with the printed board 23 and the U-shaped core 21b is provided on the side of the transformer 11 as shown in FIG. 5 or a configuration in which the high-voltage components are provided on the printed board 23 side in a lower part as shown in FIG. 6.

In the structure of a transformer unit 200 shown in FIG. 4, a clearance corresponding to the protrusion of the I-shaped core 21a from the bobbin 13 is generated between the side surface of the bobbin 13 provided on the lower side of the transformer 11 and the printed board 23, and a component 41 having a flat shape can be mounted on the clearance. Consequently, the mounting surface of the printed board 23 can effectively be utilized so that a space efficiency can be enhanced. Moreover, the height of the transformer 11 from the printed board 23 surface can be reduced so that a mounting stability can be enhanced. Furthermore, a high-voltage component generating heat is provided on an upper surface. Consequently, a heat transfer to the other portions of the transformer 11 can be suppressed during heat radiation so that the influence of the high-voltage component on the transformer 11 can be eliminated.

On the other hand, in the structure of a transformer unit 300 shown in FIG. 5, a primary winding 15, a secondary winding 17 and a heater winding which have flat shapes are provided vertically in the same manner as those in the structure shown in FIG. 3. Consequently, the installation area of the printed board 23 can be reduced so that the mounting density of the printed board 23 can be enhanced.

In the structure of a transformer unit 400 shown in FIG. 6, a distance between each winding and a printed board is increased so that the superposition of a noise on the circuit of the printed board can be prevented as much as possible.

While the terminal of the heater winding and the lead wire terminal to be connected to the magnetron are provided on the transformer 11 side in the transformer units 100 to 400, it is also possible to employ such a structure that these terminal sections are connected to the printed board 23. More specifically, these terminal sections are connected to the circuit pattern of the printed board 23 and are connected from the printed board 23 to the magnetron by a high-voltage lead wire through a tab terminal. By changing a length on the high-voltage lead wire side which carries out a connection from the printed board 23 to the magnetron, thus, it is not necessary to change a wiring length to the magnetron for each type of the unit. Consequently, it is possible to prevent an assembly work for adjusting the combination of the type of the transformer unit and the high-voltage lead wire from being complicated. Consequently, it is possible to further set the component surface of the side surface of the bobbin 13 having a limited area into a surface in which components are arranged in order. In this case, a circuit pattern for high-voltage insulation which is required for the printed board 23 corresponding to one high potential is enough and can be accommodated in a slight increased area.

Next, description will be given to a variant of the transformer according to the embodiment.

Figure 7:
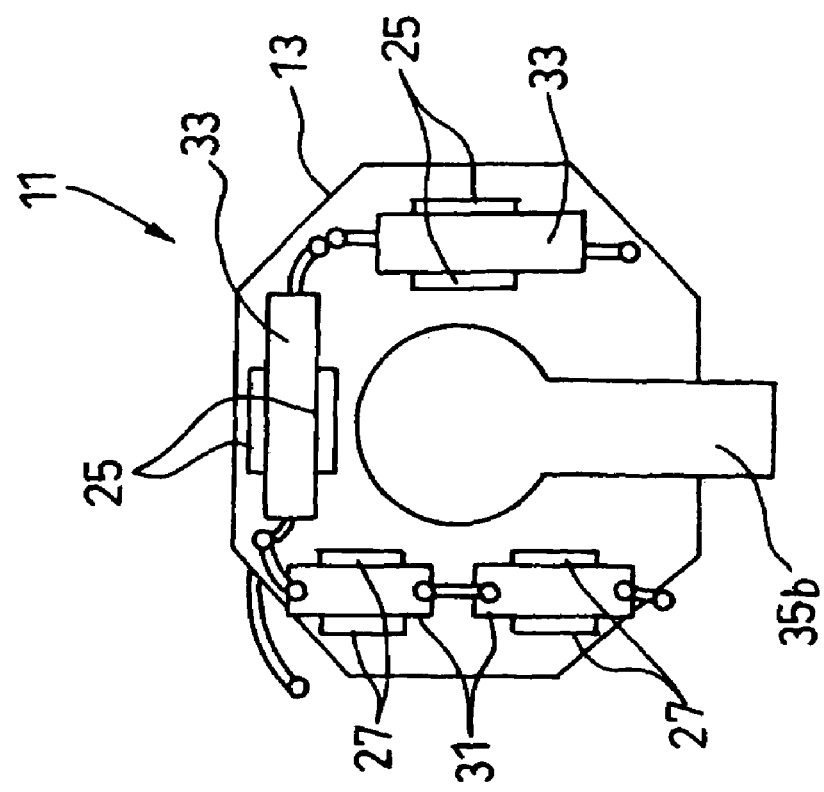
FIG. 7 is sectional and side views showing a transformer having another structure.
Figure 7:
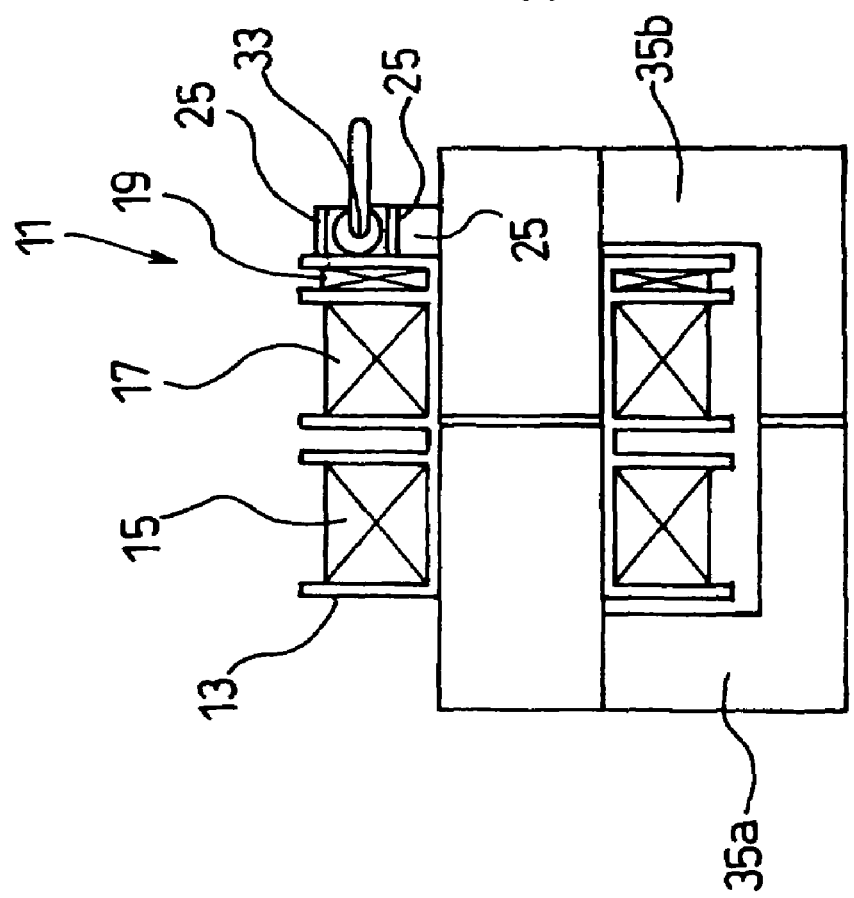

A transformer 11 shown in FIG. 7 uses two U-shaped cores 35a and 35b formed to have identical shapes to each other in place of the core 21 including the I-shaped core 21a and the U-shaped core 21b, and the U-shaped cores 35a and 35b are inserted from both end sides of a bobbin 13. The portions of the U-shaped cores 35a and 35b to be inserted into the bobbin 13 are formed to have circular sections.

According to this structure, the cores 35a and 35b are formed to have the identical shapes to each other. Consequently, the productivity of each of the cores 35a and 35b can be enhanced and a work for assembling them can also be simplified because it is not necessary to distinguish both of them in the transformer 11, moreover, the wound portion of a winding on the center of the bobbin 13 can also have a circular section. Consequently, it is possible to smoothly carry out a work for winding a primary winding 15, a secondary winding 17 and a heater winding 19 without the influence of a change in a circumferential speed in case of a square section.

Another method of attaching high-voltage components to the transformer 11 will be sequentially described with reference to FIGS. 8 to 10.

Figure 8:
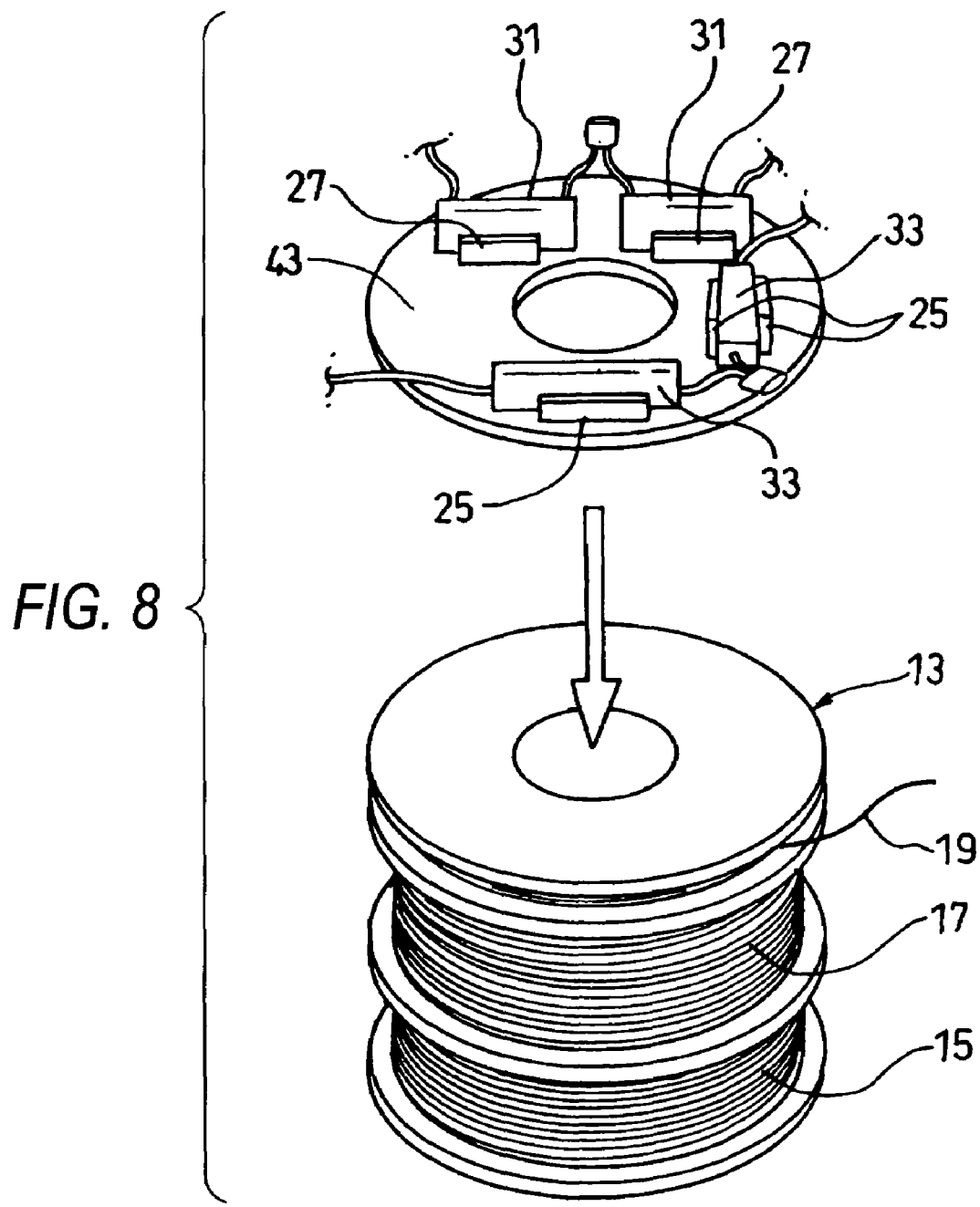
FIG. 8 is an explanatory view showing a structure in which a component holding section is formed on a component fixing plate to be a separate member from a bobbin.

In a configuration shown in FIG. 8, the high-voltage components of a component fixing plate 43 constituted separately from the bobbin 13 having the primary winding 15, the secondary winding 17 and the heater winding 19 wound therearound are attached to the bobbin 13. Interposing pieces 25 and 27 according to an example of a component holding section are formed on the component fixing plate 43, and a capacitor 31 and a diode 33 which are the high-voltage components are fixed thereto. With such a structure, the high-voltage components are assembled into the component fixing plate 43 before each winding process and the component fixing plate 43 is connected to the bobbin 13 through bonding means which is not shown. Thus, the winding process can be carried out in a state in which the component fixing plate 43 and the bobbin 13 are integrated with each other. Consequently, it is possible to easily carry out a processing for the end of each winding by connecting the end of the winding to the lead wire of the high-voltage component after the winding process. Thus, a workability can be enhanced, and furthermore, the handling property of the transformer itself can be improved.

Figure 9:
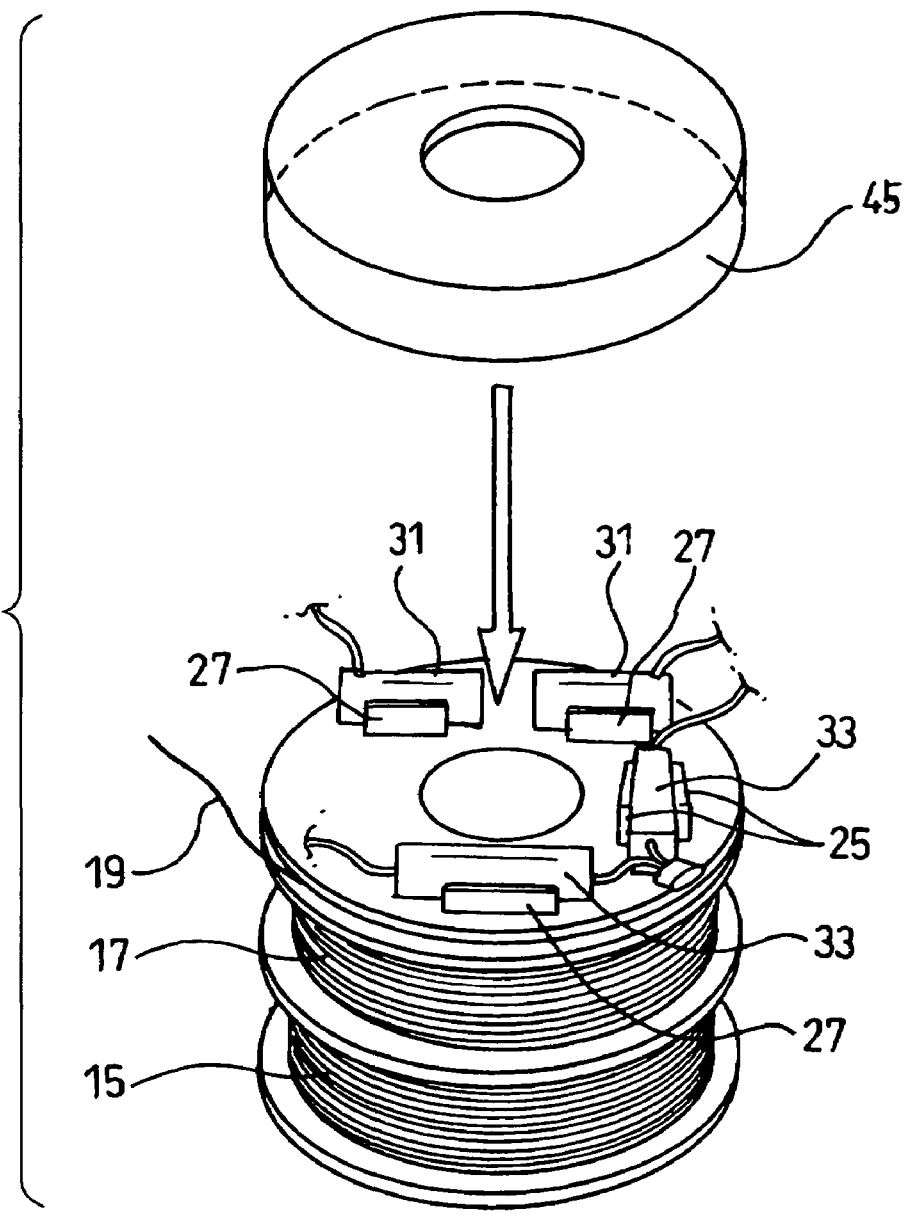
FIG. 9 is an explanatory view showing a state in which an insulating cover covering the component holding section is attached.

In a configuration shown in FIG. 9, there is employed a structure in which an insulating cover 45 for covering high-voltage components attached to the side of the bobbin 13 and attached to the bobbin 13 is provided. The insulating cover 45 is attached to the side of the bobbin 13 so that the high-voltage components 31 and 33 are accommodated in the insulating cover 45 and can be prevented from being exposed to the outside. Consequently, the generation of a short circuit can be prevented so that a high safety can be maintained.

Moreover, the insulating cover 45 may have a structure in which a component holding section for fixing the high-voltage components is further formed on an internal surface to fix the high-voltage components on the insulating cover 45 side. It is preferable that a radiation hole for radiating the heat of the high-voltage components should be properly provided on the insulating cover 45.

Figure 10:
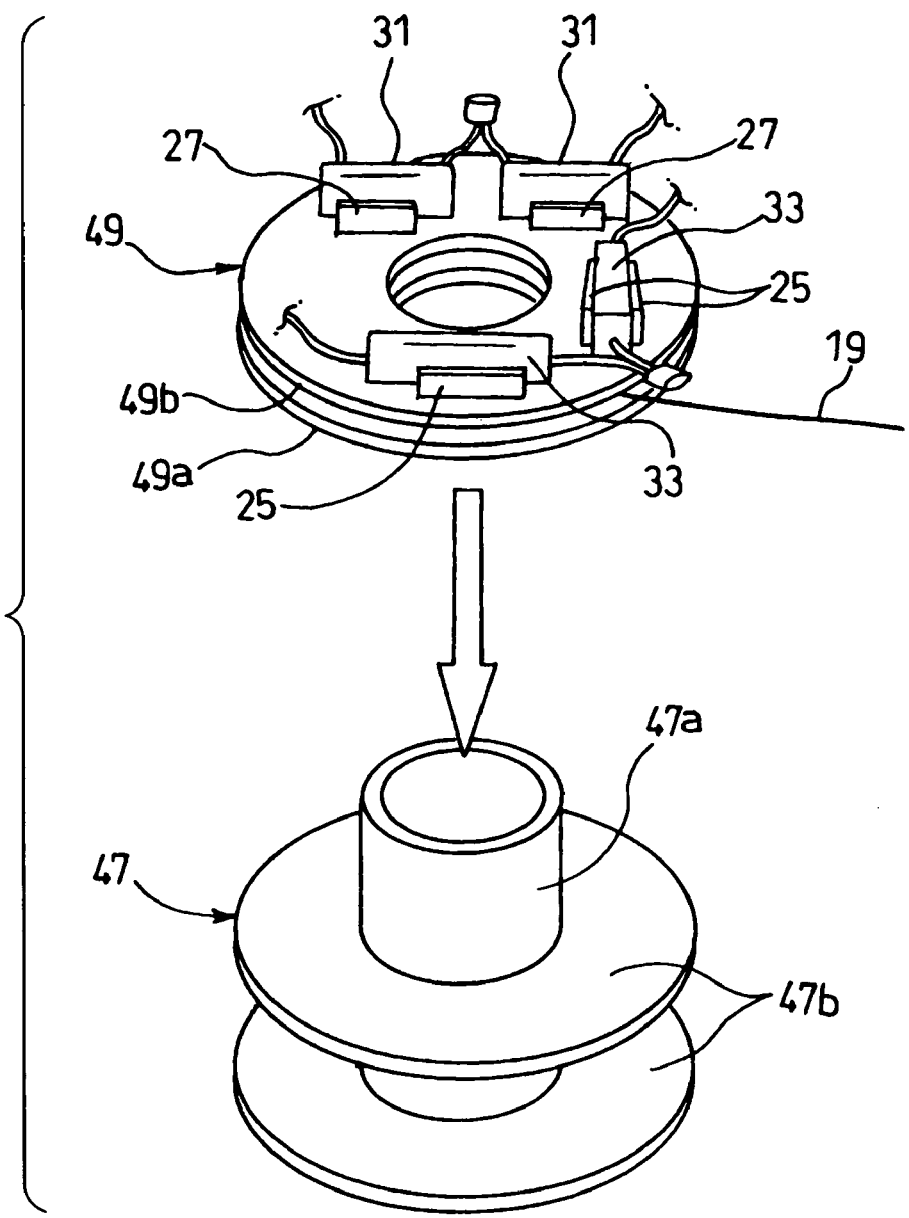
FIG. 10 is an explanatory view showing a structure in which the bobbin is exploded into a bobbin base member and a flange section and the component holding section is formed in the flange section.

In a configuration shown in FIG. 10, a bobbin comprises a bobbin base member 47 for wining at least a primary winding and a second winding therearound and a side end flange section 49 attached to one of the ends of the bobbin base member 47, and a component holding section is formed in the side end flange section 49. In more detail, the bobbin base member 47 has a core section 47*a* and a flange section 47*b* in such a manner that the primary winding and the secondary winding can be wound therearound, and the side end flange section 49 has a space for winding a heater winding which is formed by an inside flange 49*a* and an outside flange 49*b* and interposing pieces 25 and 27 according to an example of the component holding section for fixing high-voltage components are formed on the outside surface of the outside flange 49*b*. The bobbin base member 47 and the side end flange section 49 are connected to each other through bonding means which is not shown, and are thus integrated.

According to this structure, the high-voltage component is assembled into the side end flange section 49 and the heater winding is attached before the process of each winding of the bobbin base member 47, the side end flange section 49 is connected to the bobbin base member 47 and the winding processes for the primary winding and the secondary winding can be carried out in a state in which the bobbin base member 47 and the side end flange section 49 are integrated. Consequently, it is possible to easily carry out the process for the end of each winding by connecting the end of the winding to the lead wire of the high-voltage component after the winding process. Thus, a workability can be enhanced, and furthermore, the handling property of the transformer itself can be improved.

Thus, the component holding section is formed on a separate member from the bobbin base member 47. Therefore, a work for attaching components can be prevented from being complicated. Thus, the work can be simplified. Moreover, the components can easily be assembled automatically so that an assembly cost can be reduced.

FIGS. 11 to 14 show a further embodiment of the transformer unit according to the invention.

In a transformer 11 used in a transformer unit 500 according to the embodiment, a pair of U-shaped cores 35*a* and 35*b* are inserted from both end sides of a bobbin 13, and a core is attached to a printed board 23 around the outside of the bobbin 13 in such a configuration as to be set in the side position of the bobbin 13 provided apart from the printed board 23 by a constant distance.

In the transformer 11 according to the embodiment, similarly, the central axis of the bobbin 13 is parallel with the printed board 23. Therefore, a primary winding 15, a secondary winding 17 and a heater winding 19 are provided vertically with respect to the printed board 23.

Figure 12:
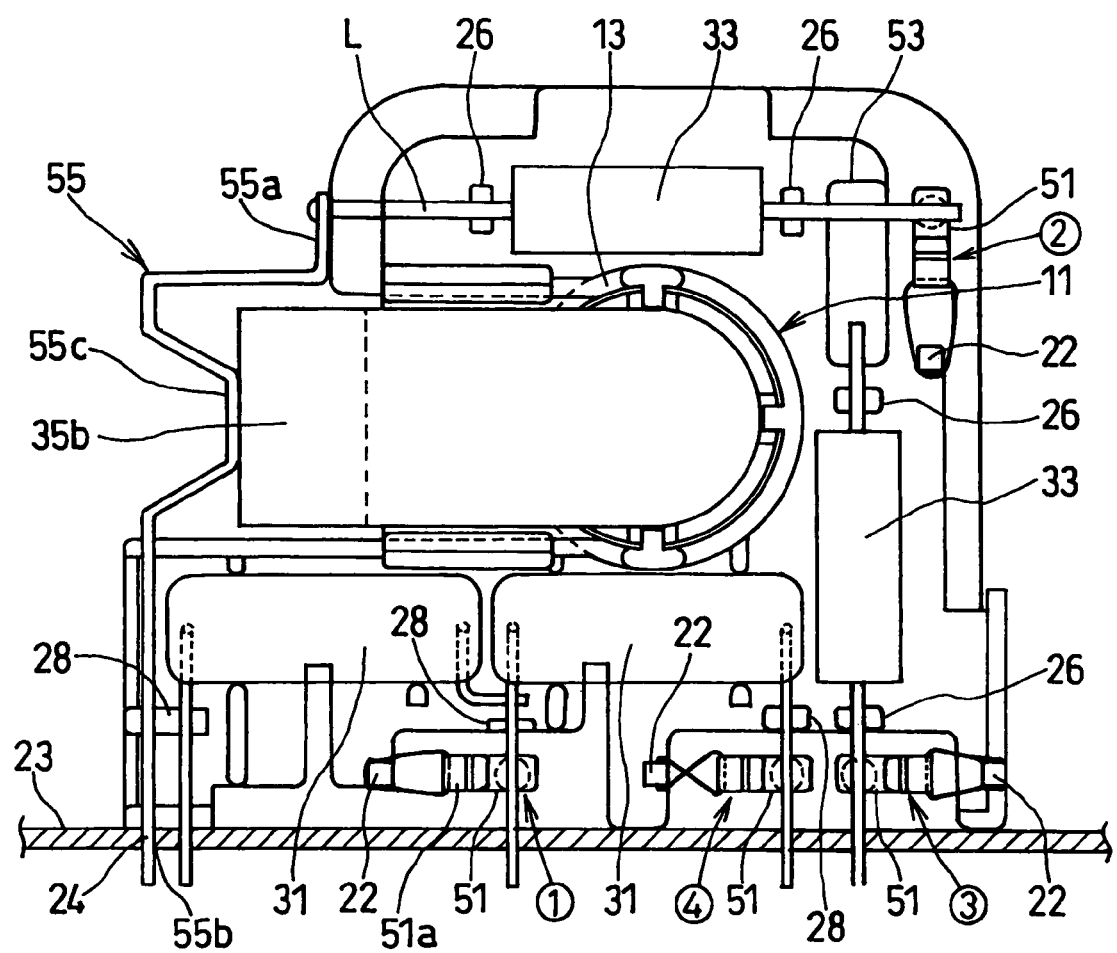
FIG. 12 is a view seen in a direction of A in FIG. 11.

As shown in FIG. 12, interposing pieces 26 and 28 to be component holding sections for interposing the lead wires of high-voltage components constituting a voltage doubler rectifying circuit 93 for rectifying a high voltage having a high frequency from the secondary winding 17 are protruded from the secondary winding 17 and the heater winding 19 in the bobbin 13.

The tip of each of the interposing pieces 26 and 28 is provided with an engagement groove for tightly fitting the lead wire, and the interposing piece 26 serves to hold a diode 33 and the interposing piece 28 serves to hold a capacitor 31.

Figure 13:
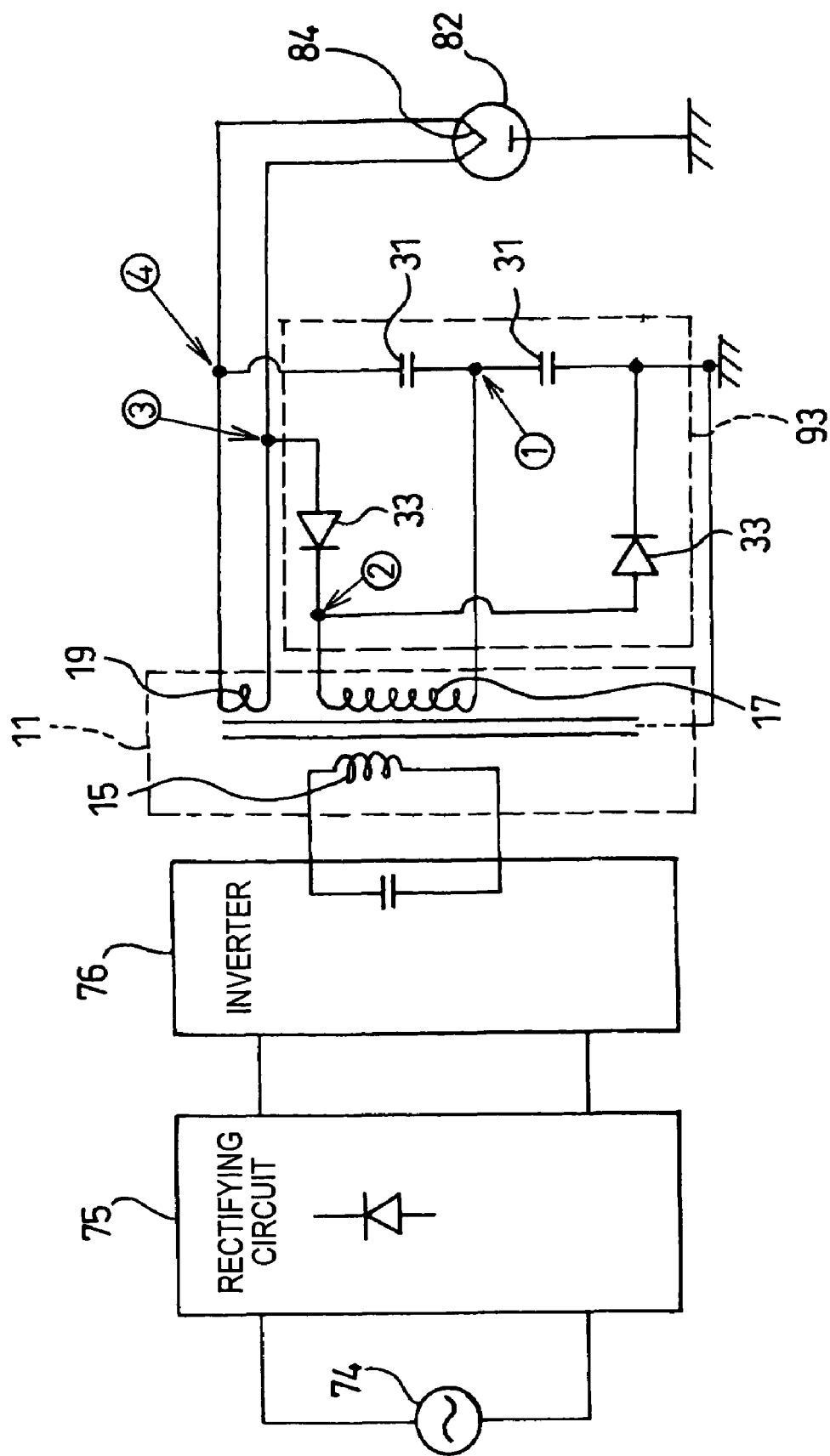
FIG. 13 is a circuit diagram showing the transformer unit illustrated in FIG. 11.

A circuit for the transformer unit 500 according to the embodiment has a structure shown in FIG. 13.

A commercial power source 74 is full-wave rectified by a rectifying circuit 75 such as a diode bridge and is converted into a high-frequency voltage by an inverter 76, and the high-frequency voltage is applied to the primary winding 15 of the transformer 11. Consequently, a high voltage having a high frequency of several kV is generated on the secondary winding 17 of the transformer 11. The high voltage having the high frequency is rectified by the voltage doubler rectifying circuit 93 comprising the capacitor 31 and the diode 33. Thus, the high voltage is applied to a magnetron 82 to be a microwave generator. Moreover, the heater winding 19 of the transformer 11 is connected to a filament 84 of the magnetron 82 to heat the filament 84. The magnetron 82 oscillates a microwave by heating the filament 84 and applying the high voltage.

In the embodiment, the capacitor 31 and the diode 33 to be the high-voltage components provided on the component holding sections have a relay terminal 51 bonded to a leadwire L connected to the secondary winding 17 and the heater winding 19 through spot welding.

Figure 14:
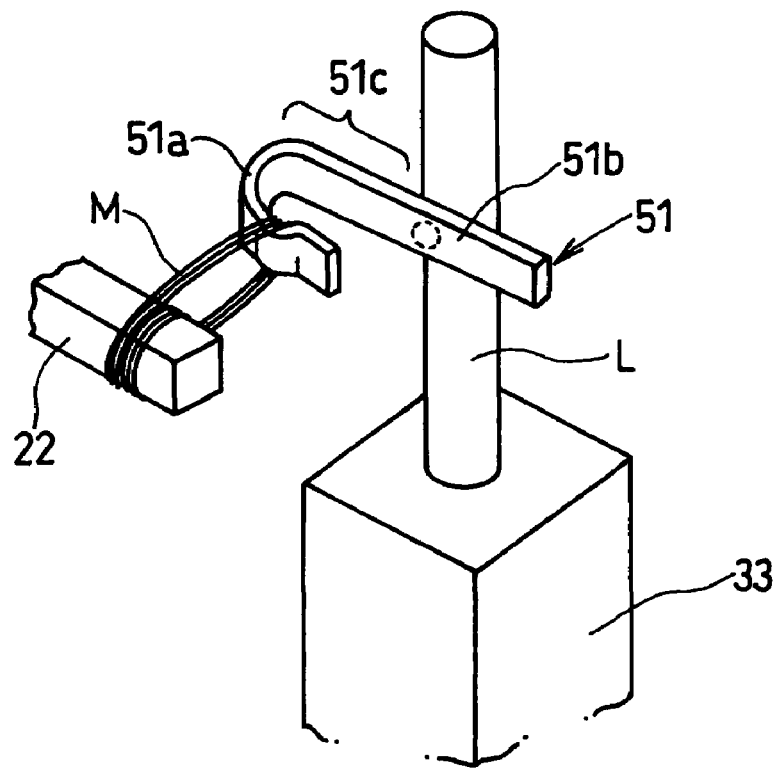
FIG. 14 is an enlarged perspective view showing a B portion in FIG. 11, (a) showing the case in which a winding M is winded and connected and (b) showing the case in which the winding M is fusing welded.
Figure 14:
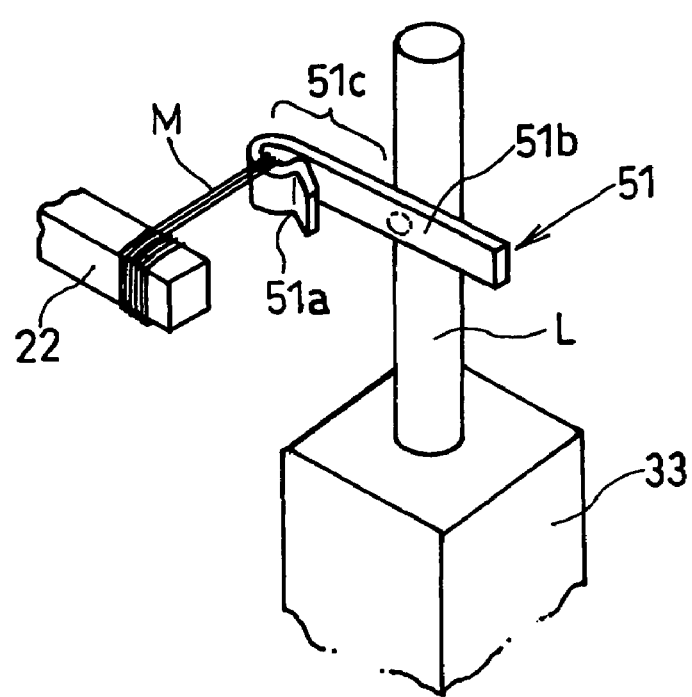

The relay terminal 51 is formed by a metal plate such as a phosphor bronze plate, for example, and includes a hook-shaped tip portion 51*a* winding and connecting a winding M, a base end 51*b* bonded to the lead wire L of the high-voltage component, and a flexible portion 51*c* opposed to the tip portion 51*a* as shown in FIG. 14(*a*).

Both the connecting end of the secondary winding 17 and that of the heater winding 19 are connected to the relay terminal 51 through a post 22 protruded from the bobbin 13.

In the case in which the secondary winding 17 and the heater winding 19 can be soldered, the relay terminal 51 is utilized to carry out the soldering. In the case in which the soldering cannot be carried out, moreover, it is possible to perform fusing by giving a large current while causing the mutual opposed portions 51*a* and 51*c* of the relay terminal 51 to be close to each other by pressure as shown in FIG. 14(*b*).

Thus, the windings 17 and 19 are once held by the post 22, In case of the soldering, consequently, it is possible to eliminate the windings 17 and 19 from becoming fragile due to copper corrosion caused by high-temperature soldering corresponding to unleading in recent years. In case of a non-soldered winding, moreover, the post 22 receives a stress against the fragility caused by a stress in welding such as fusing so that a stress in the relay terminal 51 portion can be minimized.

Winding connecting portions 1) to 4) obtained by the relay terminal 51 shown in FIG. 12 correspond to connecting portions 1) to 4) on a circuit diagram of FIG. 13.

More specifically, the connecting portion 1) is provided between one of the connecting ends of the secondary winding 17 and a pair of capacitors 31, and the connecting portion 2) is provided between the other connecting end of the secondary winding 17 and a pair of diodes 33.

Moreover, the connecting portion 3) is provided between one of the leads of the heater winding 19 and a lead L of the anode of the diode 33, and the connecting portion 4) is provided between the other lead of the heater winding 19 and the lead L of the capacitor 31.

In general, conductor strands used in the secondary winding 17 and the heater winding 19 are very thin. For this reason, there is a possibility that the conductor strands might be cut if a constant tension or more acts on the connecting ends of the secondary winding 17 and the heater winding 19 due to the run-out and looseness of the component holding section by an operating force in assembly and a vibration generated during transportation when the transformer 11 is to be assembled into the printed board 23.

In the transformer unit 500, however, a run-out and a looseness are generated on the component holding section due to an operating force in assembly. Even if the high-voltage components 31 and 33 to which the connecting end of the secondary winding 17 is connected are displaced due to the run-out and looseness, the displacement is absorbed in an allowance between the post 22 and the relay terminal 51, thereby preventing a constant tension or more from acting on the connecting portion of the secondary winding 17 and the heater winding 19. Consequently, it is possible to prevent the secondary winding 17 and the heater winding 19 from being cut and to enhance a handling property in the assembly of the transformer 11 into the board and a reliability in transportation.

Figure 11:
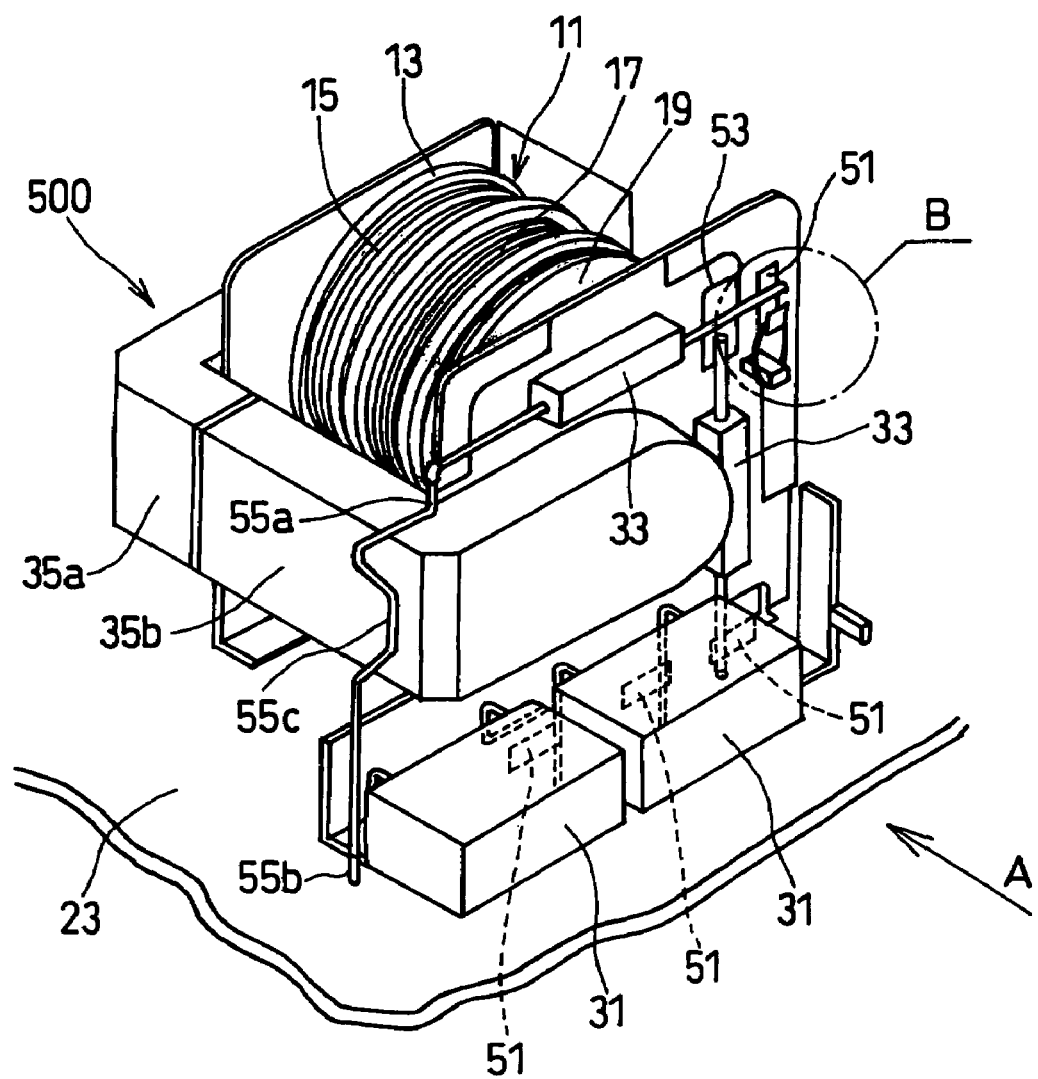
FIG. 11 is a perspective view showing another embodiment of the transformer unit according to the invention.

In the embodiment, moreover, the mutual electrical connection of the lead wires of the high-voltage components provided on the component holding section is not carried out directly but through a plate-shaped connecting terminal 53 as shown in FIGS. 11 and 12.

In the example shown in the drawing, the plate-shaped connecting terminal 53 is used in a portion in which a pair of diodes 33 and 33 are mutually connected in series.

For the connecting terminal 53, a metal plate having an excellent characteristic in a radiating property (a thermal conductivity) as well as an electrical conductivity is preferable, and a phosphor bronze plate can be used, for example.

The connecting terminal 53 has a large radiating surface for the lead wires of the high-voltage components and has an excellent radiating property. Therefore, heat generated on each high-voltage component can be efficiently radiated into an ambient atmosphere to prevent the temperature of each high-voltage component from being raised, and at the same time, a stress generated in the connecting portion due to the thermal expansion of the component can be suppressed. Consequently, it is possible to enhance the operating stability of each high-voltage component and to prolong the life of the connecting portion.

In the embodiment, moreover, the diode 33 and the capacitor 31 in the voltage doubler rectifying circuit 93 to be connected to the heater winding 19 incorporated in the transformer 11 are individually connected to the heater winding 19, that is, the lead terminal of the diodes 33 connected in series is connected to one of the leads of the heater winding 19 and the lead terminal of the capacitors 31 connected in series is connected to the other lead of the heater winding 19 as shown in 3) and 4) of FIG. 13.

The relay terminal 51 is used for the connection of the respective lead terminals and the windings as described above.

Figure 15:
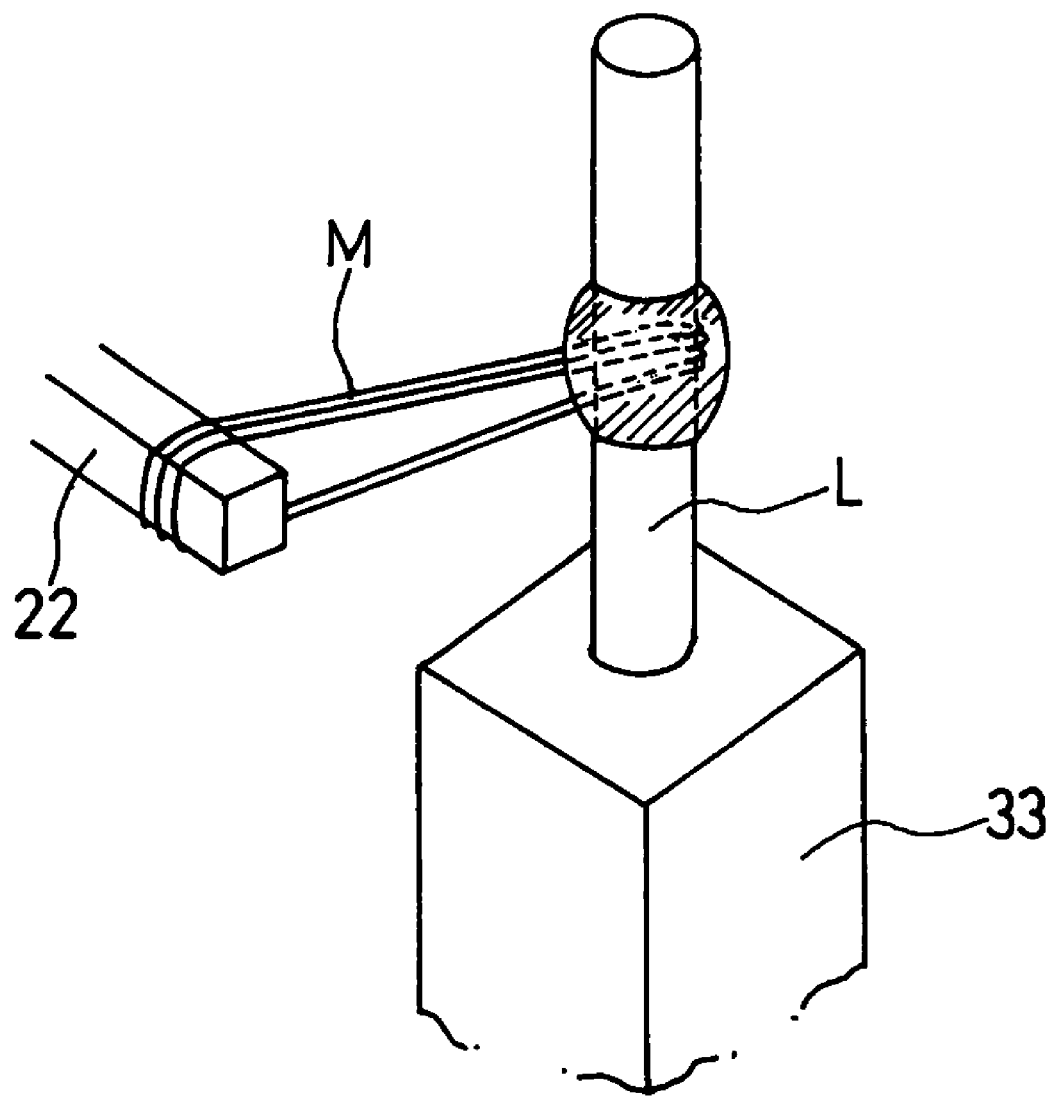
FIG. 15 is an enlarged perspective view showing the B portion in FIG. 14 according to a variant, in which the secondary winding of a transformer is soldered to the lead wire of a high-voltage component through a post protruded from a bobbin and directly connected.

While the secondary winding 17 and the heater winding 19 are bonded to the lead wire L of the high-voltage component through the relay terminal 51 in the embodiment, it is also possible to employ a structure in which the relay terminal is omitted and the secondary winding 17 and the heater winding 19 are soldered to the leadwire L of the high-voltage component via the post 22 protruded from the bobbin 13 and are thus bonded directly as shown in FIG. 15.

With such a structure, similarly, the displacement of the lead wire L of the high-voltage component can be absorbed in the allowances of the windings 17 and 19 provided between the post 22 and the lead wire L. Thus, the windings 17 and 19 can be prevented from being cut.

Moreover, the windings 17 and 19 are once held by the post 22. Consequently, it is possible to eliminate the fragility of the windings 17 and 19 which is caused by high-temperature soldering corresponding to unleading.

Figure 18:
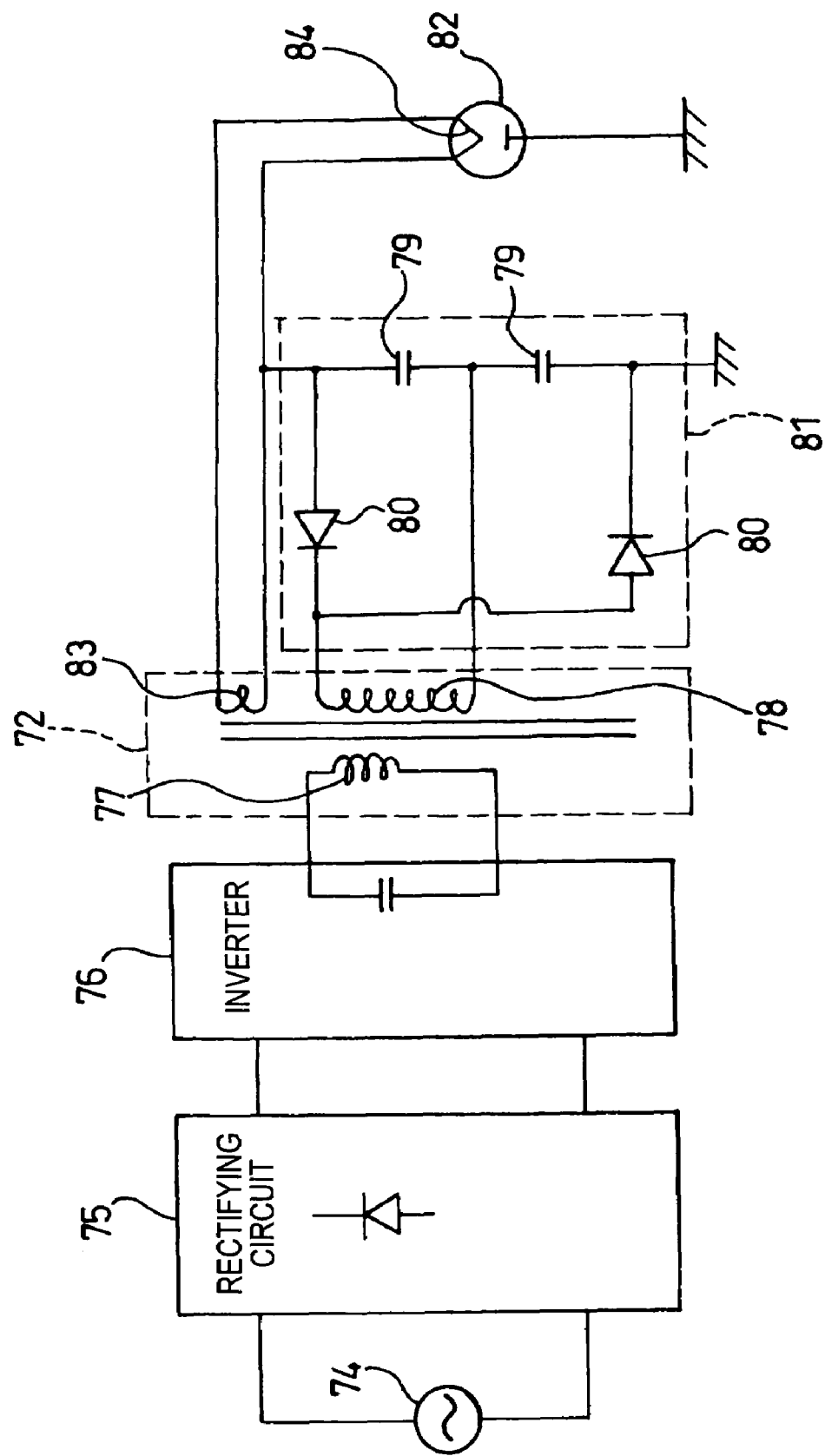
FIG. 18 is a circuit diagram for explaining the circuit structure of the transformer unit.
Figure 19:
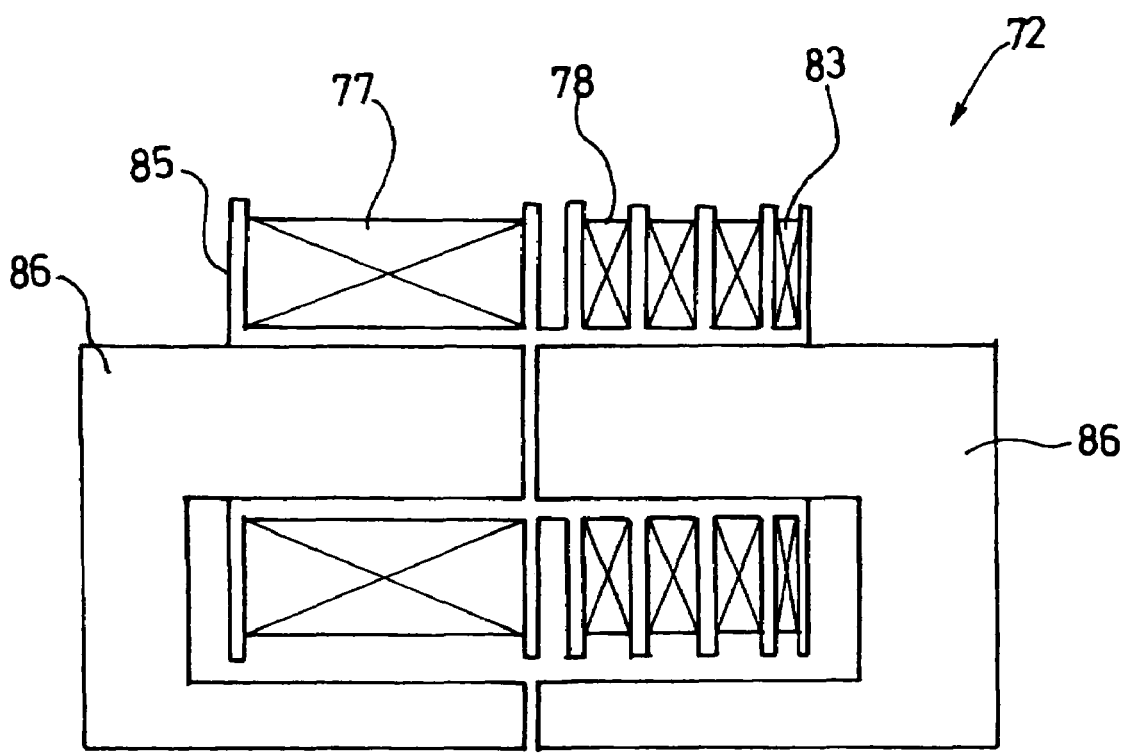
FIG. 19 is a schematic sectional view showing the structure of a transformer mounted on the transformer unit.
Figure 20:
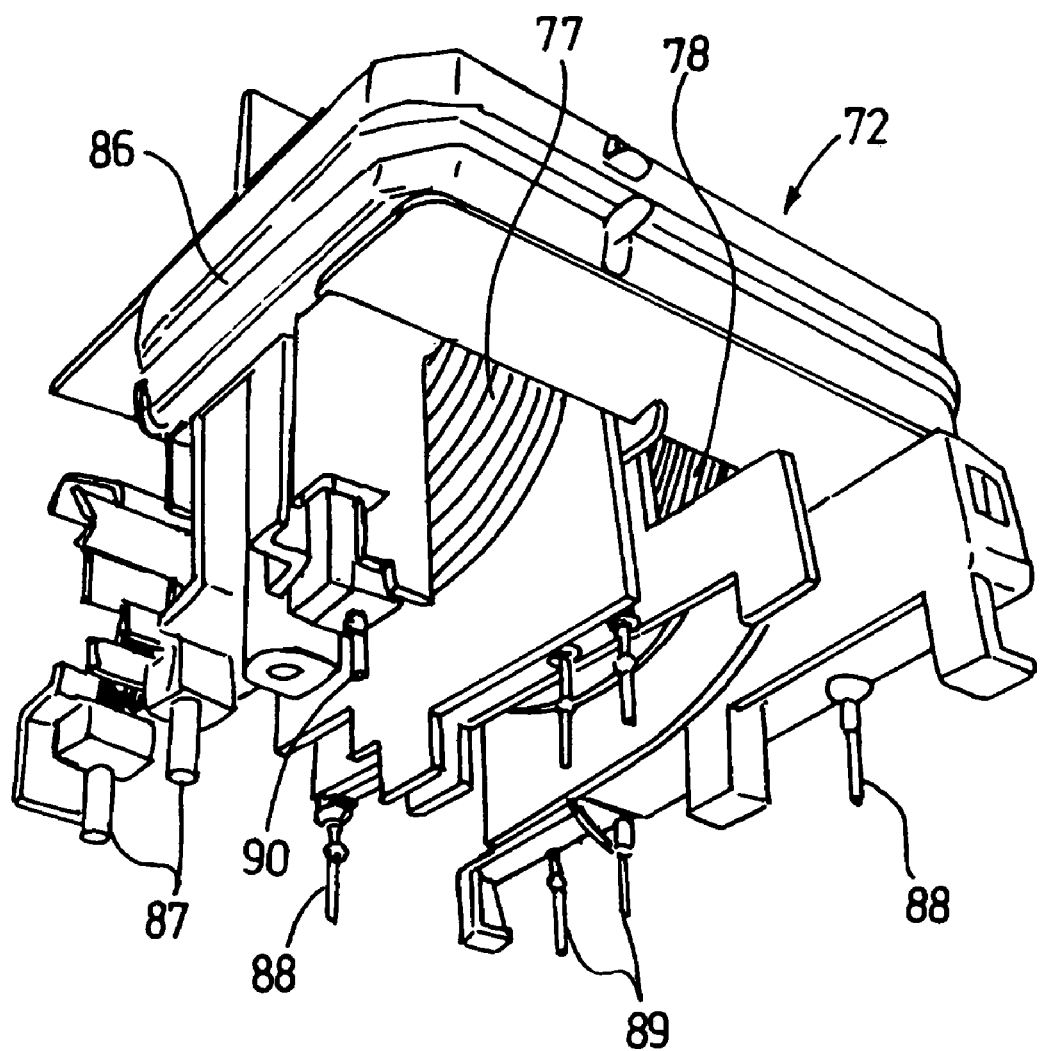
FIG. 20 is a perspective view showing the structure of the transformer seen from the lower side.
Figure 21:
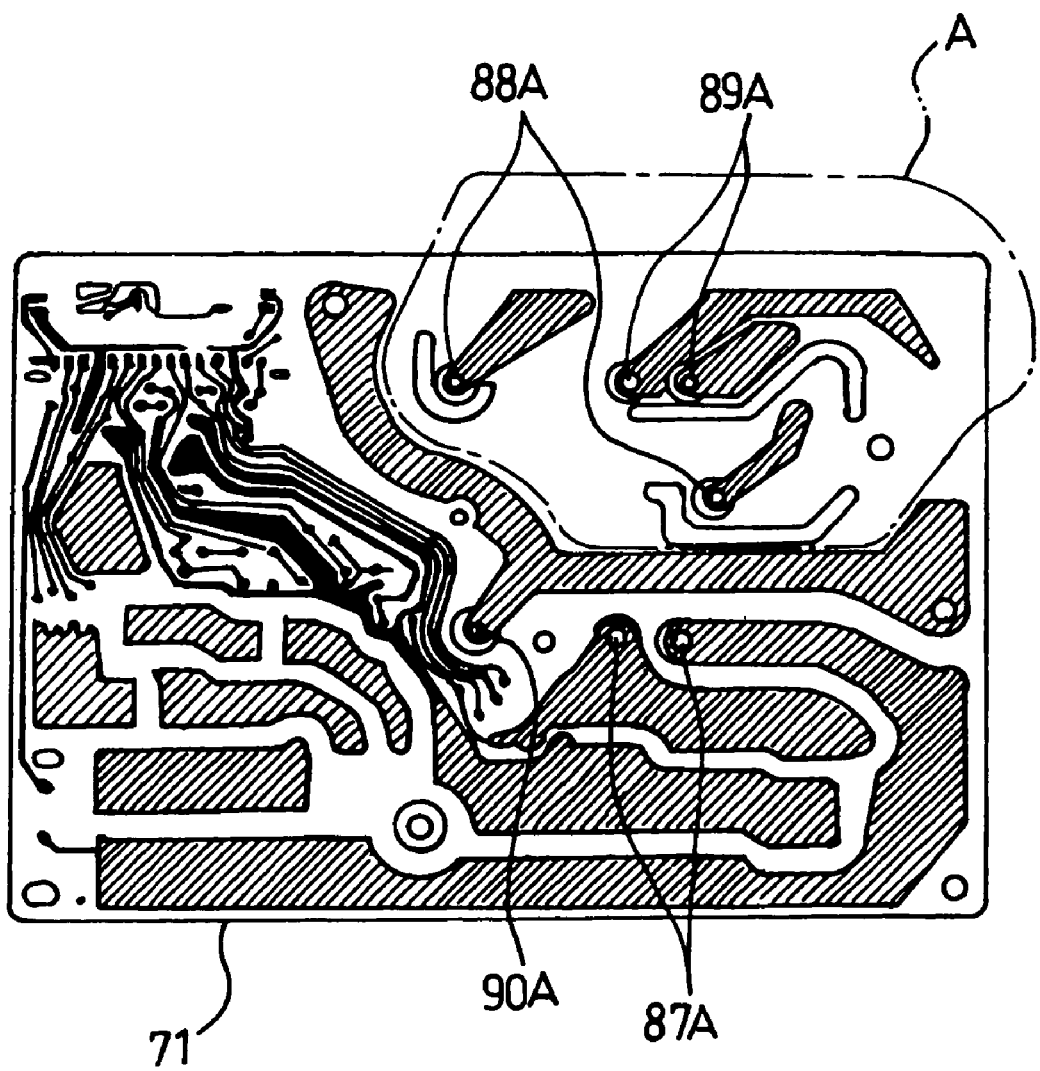
FIG. 21 is a back view showing a printed board, illustrating the circuit pattern of a printed board on which the transformer is mounted.
Figure 22:
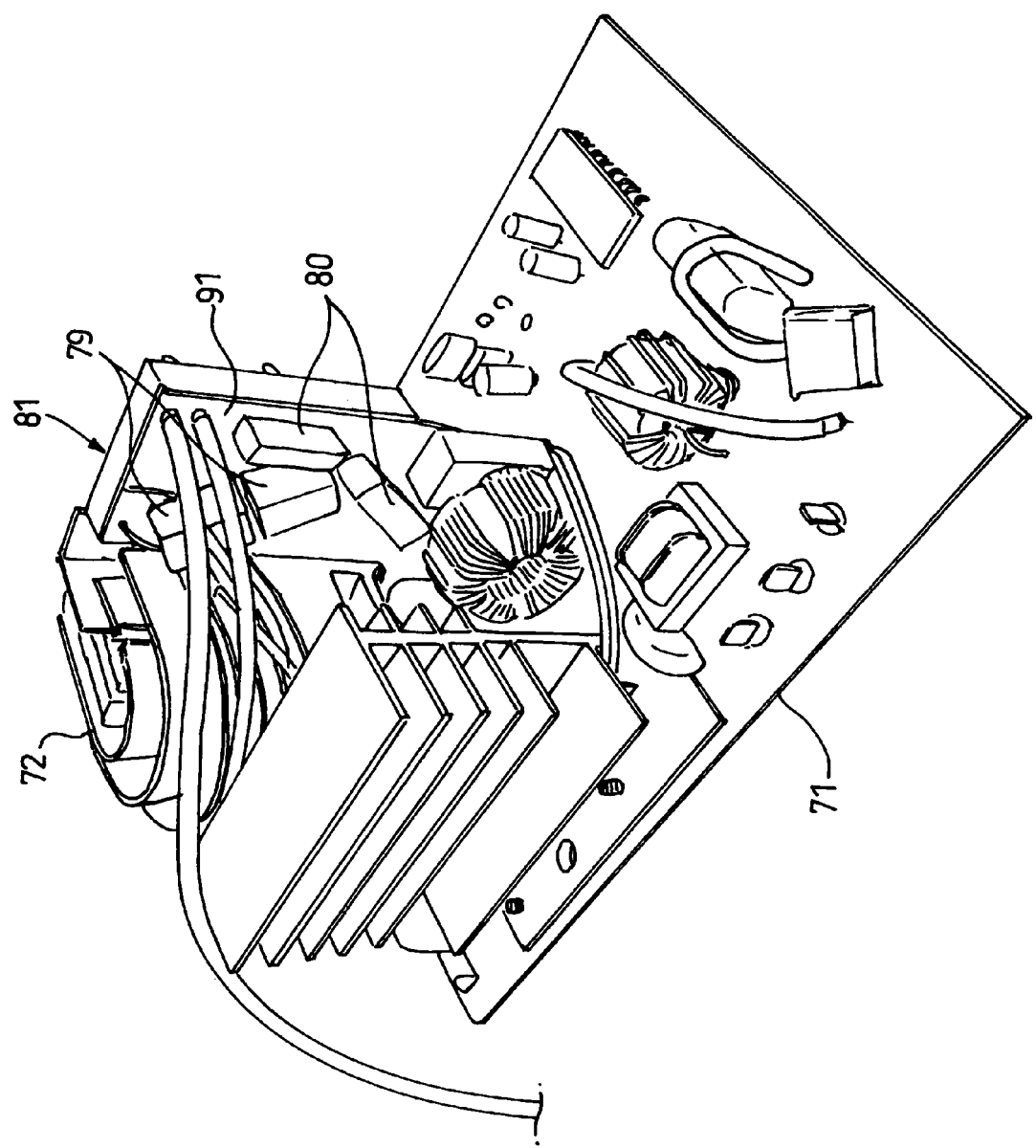
FIG. 22 is a perspective view showing a transformer unit according to another conventional example.

In the case in which the diode 33 and the capacitor 31 in the voltage doubler rectifying circuit 93 are to be connected to the heater winding 19 incorporated in the transformer 11, generally, the connecting portion of the diode 33 and the capacitor 31 is connected to one of the leads of the heater winding through a single jumper wire as shown in a circuit diagram of FIG. 18. In such a connecting structure, however, the use of a dummy terminal on the bobbin 13 is indispensable in order to support the other lead of the heater winding on a distribution path.

With such a structure that the lead terminal of the diode 33 and the lead terminal of the capacitor 31 are individually connected to one of the leads of the heater winding 19 and the other lead of the heater winding 19 respectively as described above, however, the leads of the heater winding 19 can be stably supported on the distribution path by the connection of the diode 33 and the capacitor 31. Consequently, the use of the dummy terminal on the bobbin 13 can be omitted. The reason why the dummy terminal can be omitted is that a voltage obtained by the voltage doubler rectifying circuit 93 is 100 to 500 times as high as a voltage generated on both ends of the heater winding 19, resulting in apparently the same motion as that of the circuit shown in FIG. 18.

In the embodiment, moreover, a ground connecting terminal 55 for connecting the voltage doubler rectifying circuit 93 provided on the component holding section to a ground contact 24 provided on the printed board 23 is obtained by forming a metal wire having an excellent electrical conductivity and spring property to take a predetermined shape and includes a lead connecting section 55a connected to the lead wire L of the high-voltage component constituting the voltage doubler rectifying circuit 93 (the cathode of the diode 33 in the example), and a board connecting section 55b connected to the ground contact 24 provided on the printed board 23.

In the ground connecting terminal 55, moreover, a core connecting section 55c for implementing a conduction with the core 35b of the transformer 11 in elastic contact with the external surface-of the core 35b is integrally formed between the lead connecting section 55a and the board connecting section 55b.

In the case in which the ground connecting terminal 55 is used for a ground connection, one ground connecting terminal 55 serves to carry out the ground connection of the voltage doubler rectifying circuit 93 and that of the core 35b. As compared with the case in which the ground connections are to be individually carried out, therefore, the number of uses of the ground connecting terminal 55 can be decreased, and at the same time, the working steps of the ground connection can be reduced. Consequently, the productivity of the transformer unit can be enhanced and a cost can be reduced by a decrease in components.

Moreover, the ground connecting terminal 55 is attached after a breakdown voltage test for the transformer 11. Therefore, it is possible to execute the breakdown voltage test for the transformer 11 while mounting the diode 33.

Figure 16:
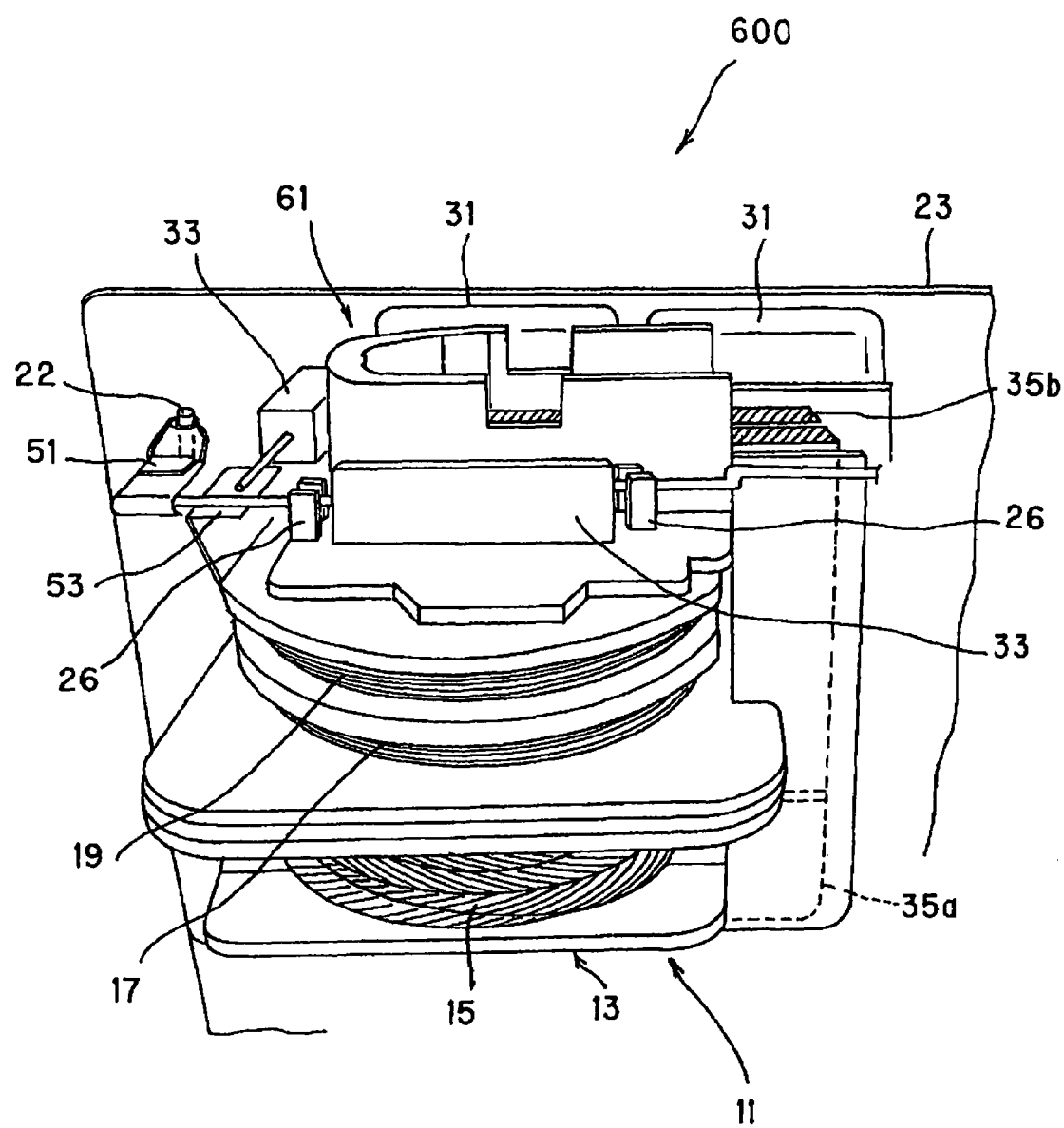
FIG. 16 is a perspective view showing a transformer unit in which a partition wall is provided between a bobbin and a core.
Figure 17:
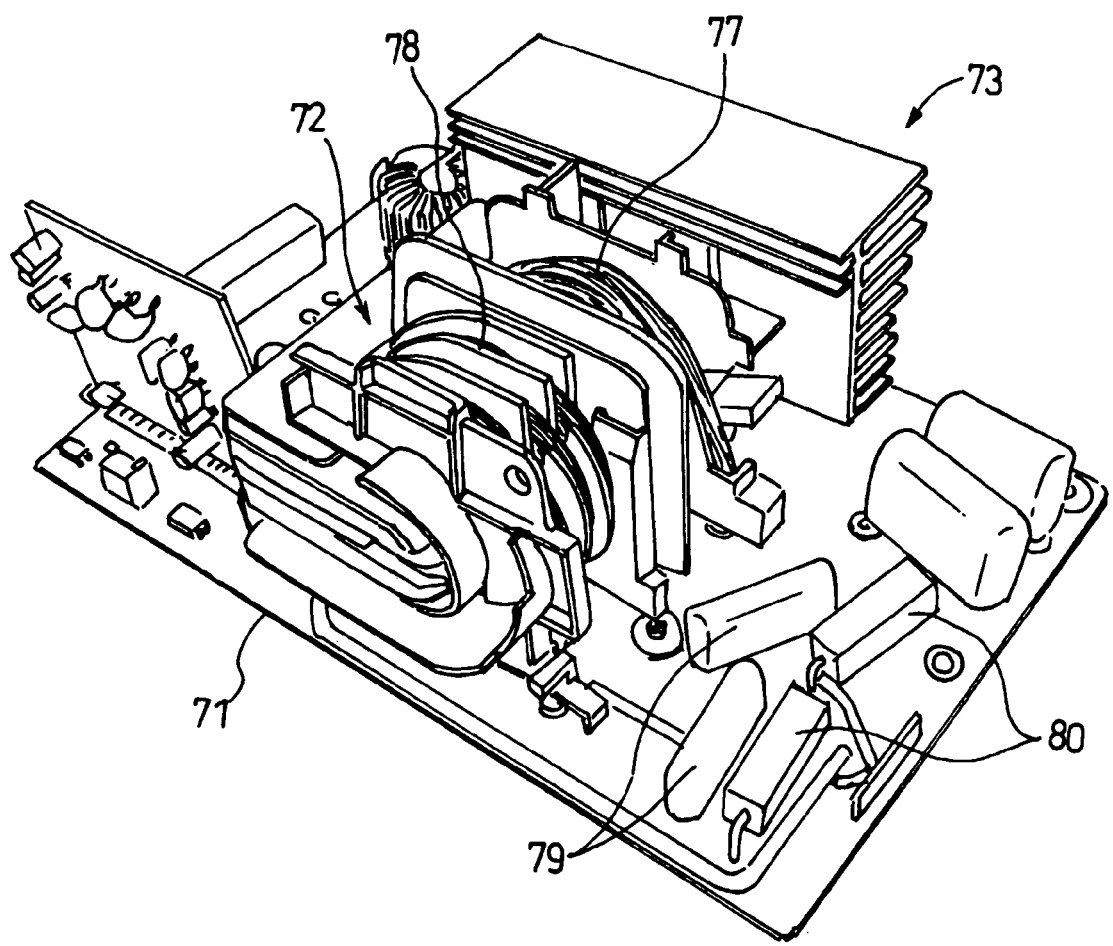
FIG. 17 is a perspective view showing a conventional transformer unit which is to be provided in a high-frequency heating device.

FIG. 16 shows an embodiment in which a partition wall is provided on the bobbin of the transformer unit according to the invention.

In a transformer 11 used in a transformer unit 600 according to the embodiment, a pair of U-shaped cores 35a and 35b are inserted from both end sides of a bobbin 13, and a core is attached to a printed board 23 around the outside of the bobbin 13 in such a configuration as to be set in the side position of the bobbin 13 provided apart from the printed board 23 by a constant distance.

In the transformer 11 according to the embodiment, the central axis of the bobbin 13 is parallel with the printed board 23. Therefore, a primary winding 15, a secondary winding 17 and a heater winding 19 are provided vertically with respect to the printed board 23.

Interposing pieces 26 and 28 to be component holding sections for interposing the lead wires of high-voltage components constituting a voltage doubler rectifying circuit 93 (see FIG. 13) for rectifying a high voltage having a high frequency from the secondary winding 17 are protruded from the secondary winding 17 and the heater winding 19 in the bobbin 13 (FIG. 16 shows only the interposing piece 26. See FIG. 12 for the interposing piece 28.).

The tip of each of the interposing pieces 26 and 28 is provided with an engagement groove for tightly fitting the lead wire, and the interposing piece 26 serves to hold a diode 33 and the interposing piece 28 serves to hold a capacitor 31.

The capacitor 31 and the diode 33 have a relay terminal 51 bonded to a lead wire connected to the secondary winding 17 and the heater winding 19 through spot welding. Both the connecting end of the secondary winding 17 and that of the heater winding 19 are connected to the relay terminal 51 via a post 22 protruded from the bobbin 13. Moreover, the mutual electrical connection of the lead wires of the high-voltage components provided on the component holding section is not carried out directly but through a plate-shaped connecting terminal 53.

In the transformer unit 600, a partition wall 61 for separating the core 35b from the capacitor 31 and the diode 33 to be the high voltage components held by the interposing pieces 26 and 28 is erected in the outer peripheral portion of the bobbin 13 in which the interposing pieces 26 and 28 to be the component holding sections are formed. The partition wall 61 is extended to be higher than the height of protrusion of the high-voltage component from a bobbin side surface 13a holding at least the same component and is provided to be present on a straight line connecting the high-voltage component to the core 35b. Although the partition wall 61 is formed integrally with the bobbin 13, a separate member may be fixed to the bobbin 13. While it is preferable that the partition wall 61 should be formed cylindrically to surround the core 35b, moreover, it is possible to divide a portion in which a very great advantage cannot be produced on the insulating effect from the high-voltage components (for example, a position corresponding to the non-electrode portion of the high-voltage component) as shown in the drawing and to form the same portion to take a U shape as in the example. A stopper (not shown) for preventing the core 35b from slipping from the bobbin 13 is engaged in the dividing position of the partition wall 61 according to the embodiment.

According to the transformer unit 600, therefore, the partition wall 61 protruded from the bobbin 13 is provided between the core 35b and the high-voltage component. Accordingly, the mutual rectilinear communication of the core 35b and the high-voltage component is lacking. Consequently, it is possible to enhance the insulating effect between the high-voltage component to which a high voltage is applied and the core 35b to be grounded. Thus, it is possible to reliably prevent an insulation from being deteriorated by a discharge between the core 35b and the high-voltage component or dust collected for a long period of time between the core 35b and the high-voltage component. Moreover, the insulating effect between the high-voltage component and the core 35b can be enhanced. As compared with a structure in which the partition wall 61 is not provided, therefore, a gap between the core 35b and the high-voltage component can be reduced and the size of the transformer unit 600 can further be decreased.

While there has been employed the structure in which the component holding section is formed on the side surface of the bobbin 13 and is caused to hold the high-voltage component in each of the embodiments, a place in which the high-voltage component is to be held is not restricted to the side surface of the bobbin 13 but may be in any other position in the outer peripheral portion of the transformer 11 excluding the mounting side on the printed board 23.

Moreover, the component holding section can also be formed on the component fixing plate constituted separately from the bobbin 13 so as to be integrated with the bobbin 13.

What is claimed is:

1. A transformer comprising:
a bobbin around which at least a primary winding and a secondary winding are wound, and a core inserted through a center of the bobbin, and mounted on a printed board,
wherein a component holding section for holding a component is provided in an outer peripheral portion excluding a mounting side on the printed board; and,
an insulating cover for covering a component held by the component holding section and attached to the bobbin side.

2. A transformer comprising:
a bobbin around which at least a primary winding and a secondary winding are wound, and a core inserted through a center of the bobbin, and mounted on a printed board,
wherein a component holding section for holding a component is provided in an outer peripheral portion excluding a mounting side on the printed board
wherein the component holding section is formed on a component fixing plate to be a separate member from the bobbin and the component fixing plate is fixed to the bobbin.

3. A transformer comprising:
a bobbin around which at least a primary winding and a secondary winding are wound, and a core inserted through a center of the bobbin, and mounted on a printed board,
wherein a component holding section for holding a component is provided in an outer peripheral portion excluding a mounting side on the printed board,
wherein the component holding section further comprises interposing pieces.

4. The transformer according to claim 3, wherein the bobbin comprises a bobbin base member for winding at least the primary winding and the secondary winding therearound, and a side end flange section to be attached to one of the ends of the bobbin base member, and the component holding section is formed in the side end flange.

5. The transformer according to claim 3, wherein the component holding section is formed on a side surface of the bobbin.

6. The transformer according to claim 3, wherein an end of the secondary winding is protruded from the outer peripheral portion excluding the mounting side on the printed board.

7. The transformer according to claim 6, wherein at least one of lead wires of components held by other component holding sections and connecting ends of the secondary winding is connected to a lead wire of the component held by the component holding section.

8. A transformer unit mounting the transformer according to claim 3 on a printed board, comprising:
a voltage doubler rectifying circuit for rectifying a high voltage having a high frequency from the secondary winding of the transformer, a high-voltage component constituting the voltage doubler rectifying circuit being held in the component holding section.

9. The transformer unit according to claim 8, wherein a connecting end of the secondary winding is directly or indirectly connected to a lead wire of the high-voltage component via a post protruded from the bobbin.

10. The transformer unit according to claim 9, wherein a plate-shaped relay terminal is bonded to the lead wire of the high-voltage component connecting the connecting end of the secondary winding, and the connecting end of the secondary winding is connected to the relay terminal.

11. The transformer unit according claim 10, wherein a mutual electrical connection of the lead wires of the high-voltage components provided on the component holding section is carried out through a plate-shaped connecting terminal serving as a radiation plate.

12. The transformer unit according claim 11, wherein in a pair of diodes connected serially and a pair of capacitors connected serially in the voltage double rectifying circuit, a lead terminal of the diode is connected to one of leads of a heater winding incorporated in the transformer and a lead terminal of the capacitor is connected to the other lead of the heater winding.

13. The transformer unit according claim 12, wherein the voltage doubler rectifying circuit and the core are connected to a ground terminal on the printed board through a common ground connecting terminal.

14. The transformer unit according to claim 13, wherein the ground connecting terminal includes a lead connecting section to be connected to a lead wire of a high-voltage component constituting the voltage doubler rectifying circuit and a board connecting section to be connected to a ground contact, and a core connecting section implementing a conduction to a core is provided in elastic contact with an external surface of the core between the lead connecting section and the board connecting section.

15. The transformer unit according claim 14, wherein a partition wall for separating the core from the high-voltage component held by the component holding section is erected in an outer peripheral portion of the bobbin provided with the component holding section.

16. The transformer unit according to claim 15, wherein the partition wall is extended to be higher that a height of protrusion of the high-voltage component from the bobbin.

* * * * *